(12) United States Patent
Yamamoto

(10) Patent No.: US 8,420,486 B2
(45) Date of Patent: Apr. 16, 2013

(54) METHOD FOR MANUFACTURING SEMICONDUCTOR DEVICE

(75) Inventor: Yuichi Yamamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 291 days.

(21) Appl. No.: 12/182,322

(22) Filed: Jul. 30, 2008

(65) Prior Publication Data

US 2009/0042348 A1   Feb. 12, 2009

(30) Foreign Application Priority Data

Aug. 7, 2007  (JP) ................. 2007-204835

(51) Int. Cl.
*H01L 21/8234* (2006.01)
*H01L 21/338* (2006.01)
*H01L 21/336* (2006.01)

(52) U.S. Cl.
USPC .............. 438/275; 438/183; 257/E21.444; 257/E21.453

(58) Field of Classification Search .............. 438/275, 438/183; 257/E21.444, E21.453
See application file for complete search history.

(56) References Cited

U.S. PATENT DOCUMENTS

| 6,033,963 | A | * | 3/2000 | Huang et al. | 438/303 |
| 7,332,433 | B2 | * | 2/2008 | Choi et al. | 438/685 |
| 2006/0278919 | A1 | * | 12/2006 | Takahashi | 257/316 |
| 2007/0241386 | A1 | * | 10/2007 | Wang et al. | 257/314 |

FOREIGN PATENT DOCUMENTS

| JP | 2000307010 A | * | 11/2000 |
| JP | 2001-102443 | | 4/2001 |
| JP | 2004-006475 | | 1/2004 |
| JP | 2004-095938 | | 3/2004 |
| JP | 2006-313901 | | 11/2006 |

\* cited by examiner

*Primary Examiner* — Charles Garber
*Assistant Examiner* — Calvin Choi
(74) *Attorney, Agent, or Firm* — SNR Denton US LLP

(57) ABSTRACT

In the present invention, there is provided a method for manufacturing a semiconductor device that has on a semiconductor substrate first and second transistor groups having different operating voltages respectively, the first transistor group having a first gate electrode, the second transistor group having a second gate electrode, the method including the steps of: forming the silicide layer on the first gate electrode of the first transistor group after setting a height of the first gate electrode smaller than a height of a dummy gate electrode formed in a dummy gate part; and forming a gate forming trench by removing the dummy gate part after forming an interlayer insulating film that covers a silicide layer and planarizing a surface of the interlayer insulating film.

7 Claims, 31 Drawing Sheets

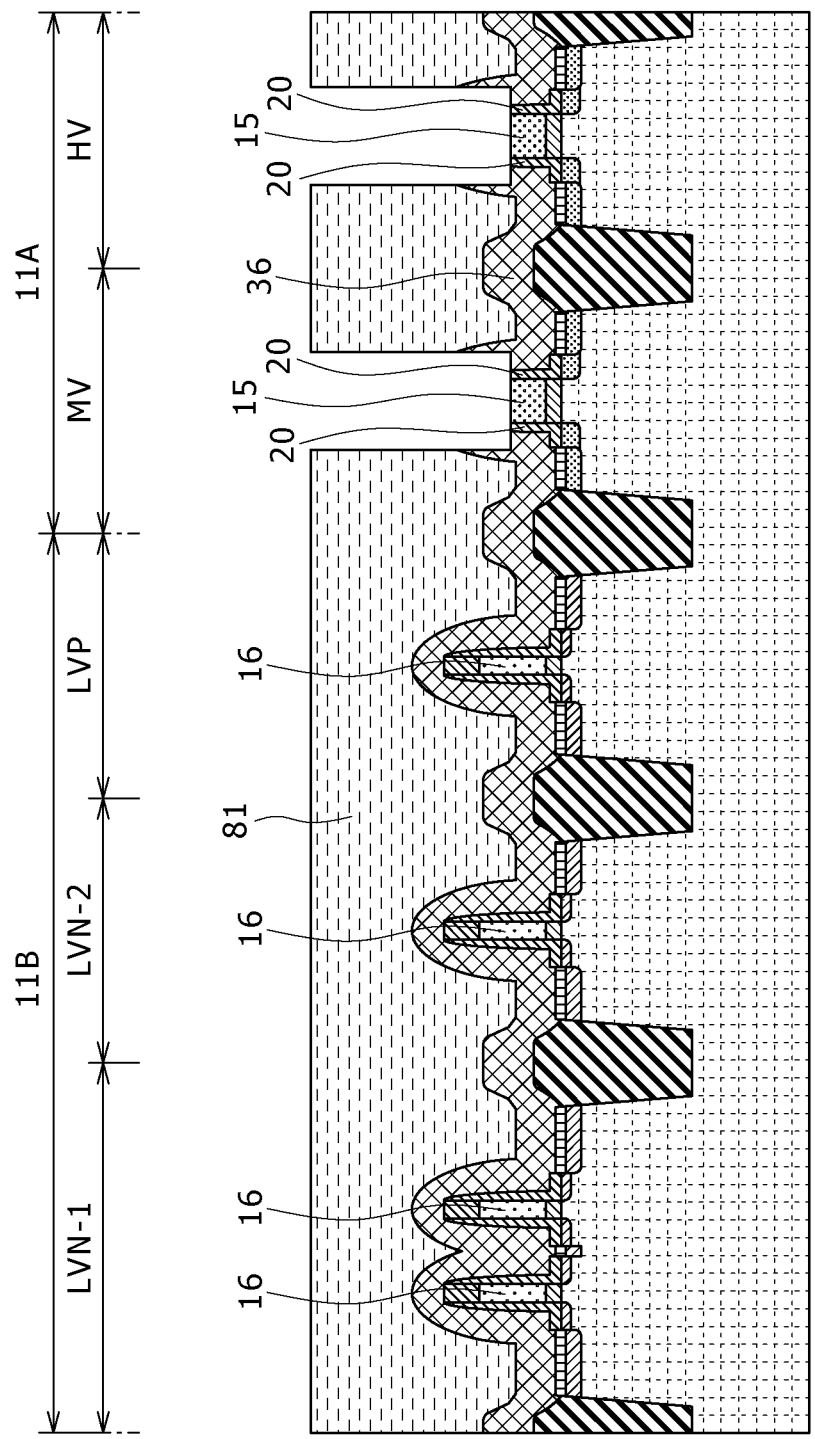

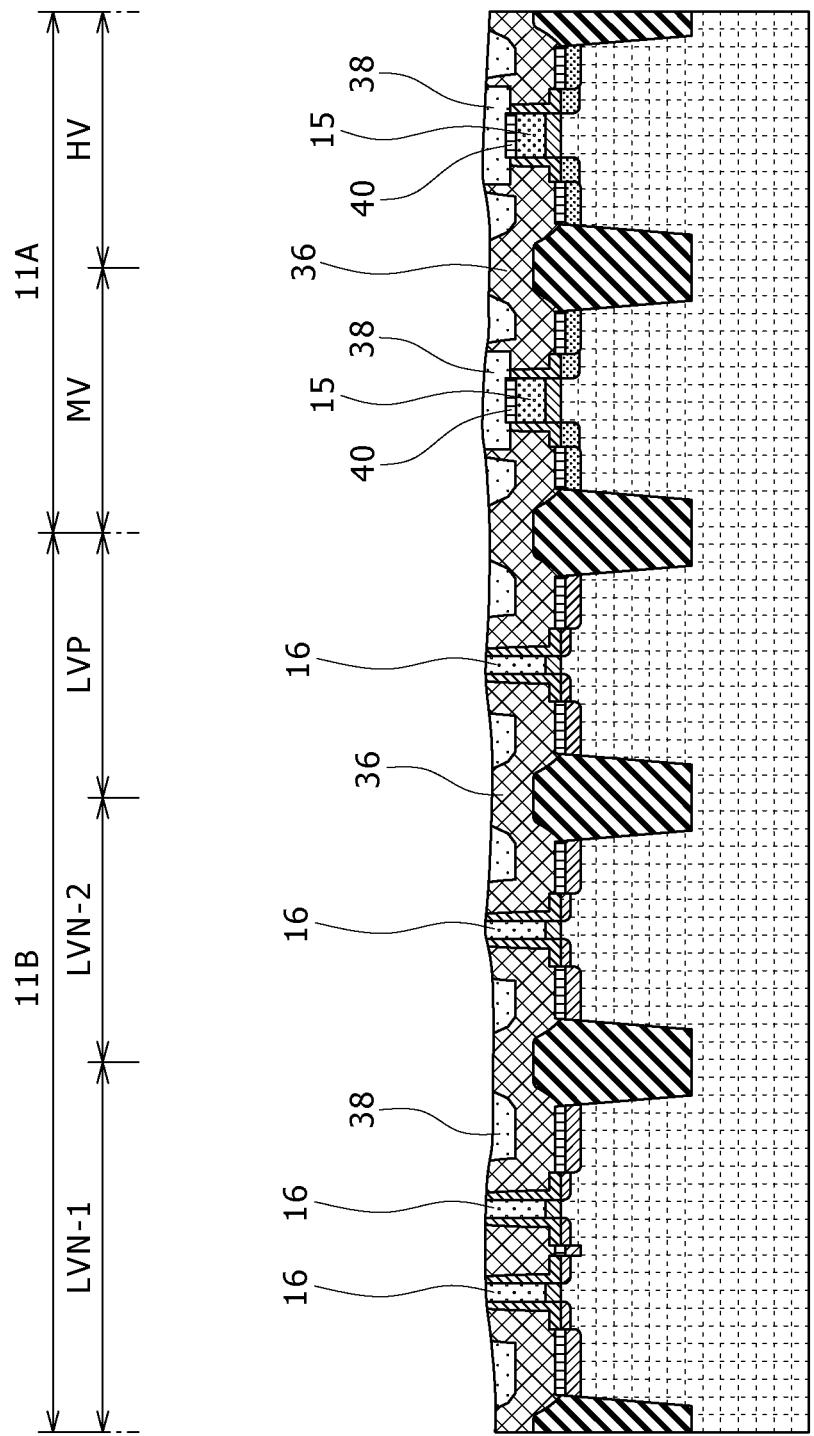

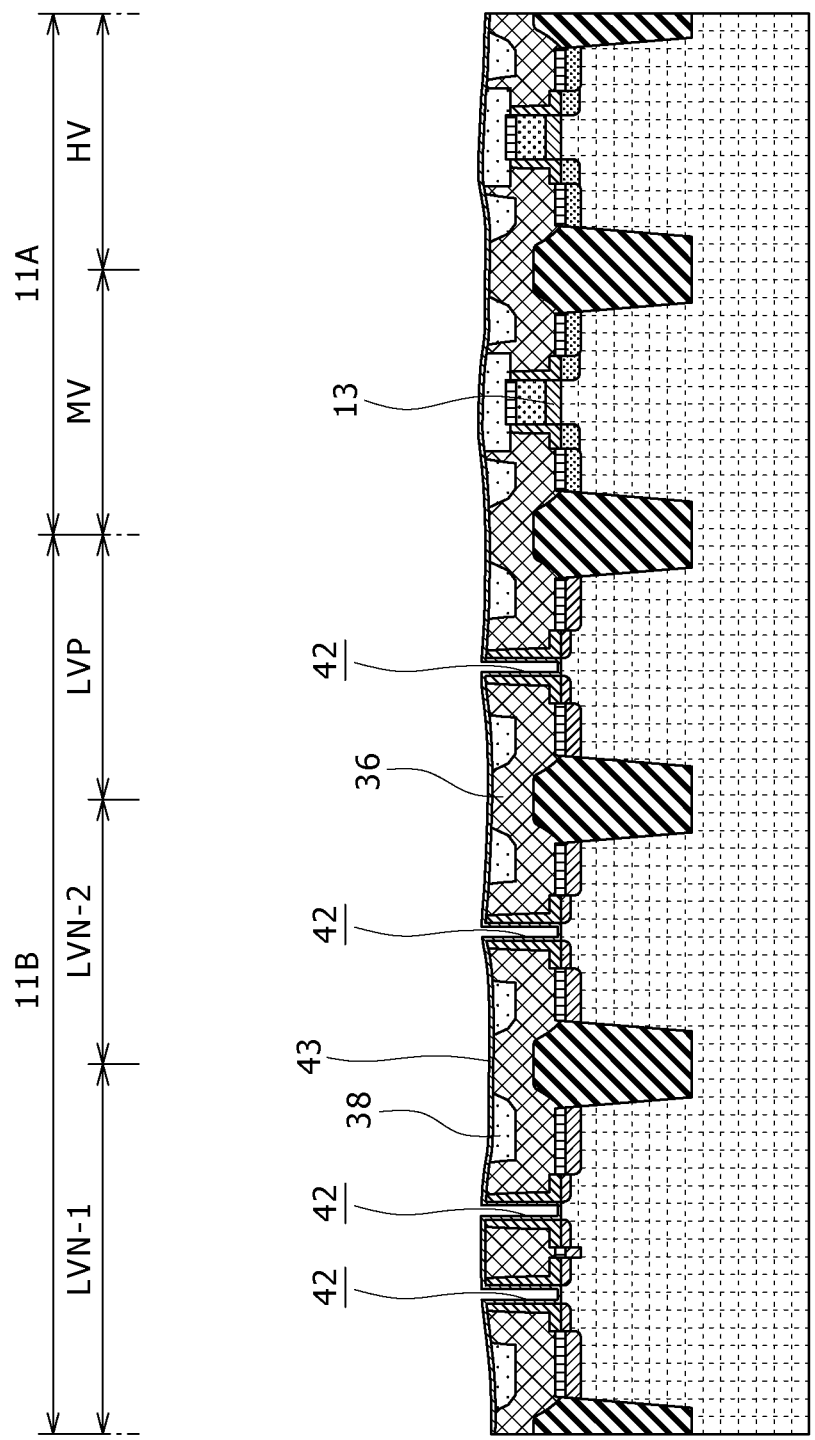

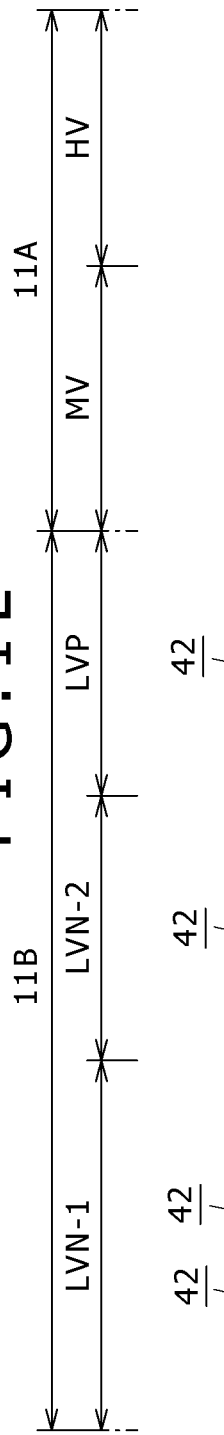
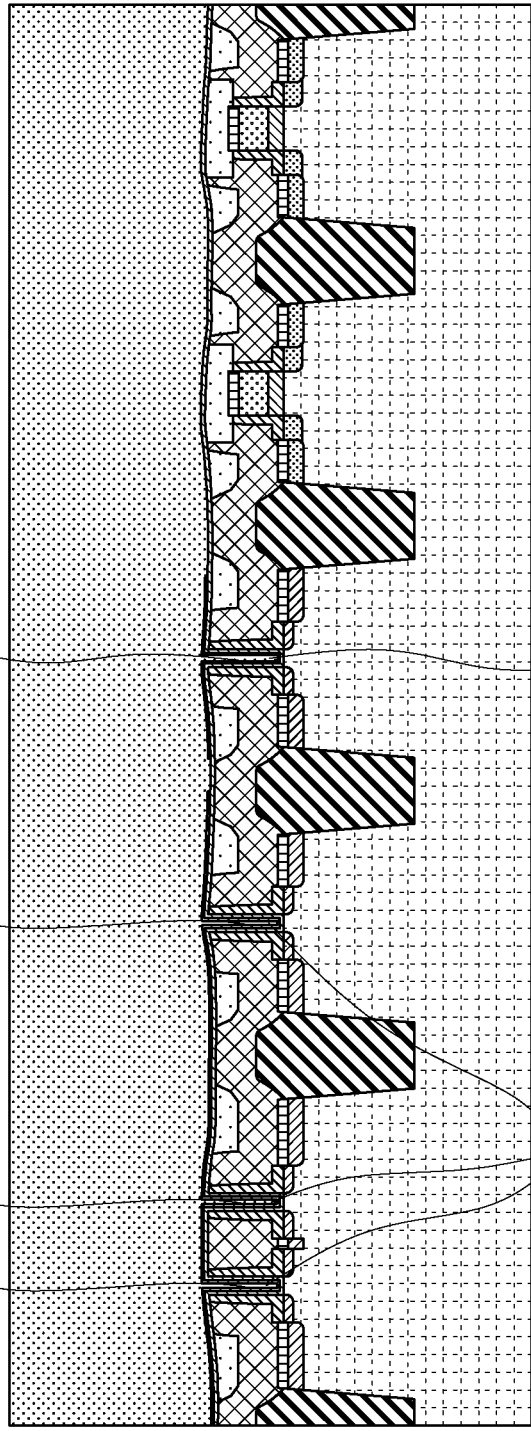
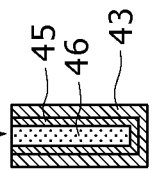
ENLARGED VIEW OF GATE FORMING TRENCH PART
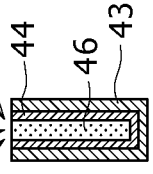
ENLARGED VIEW OF GATE FORMING TRENCH PART

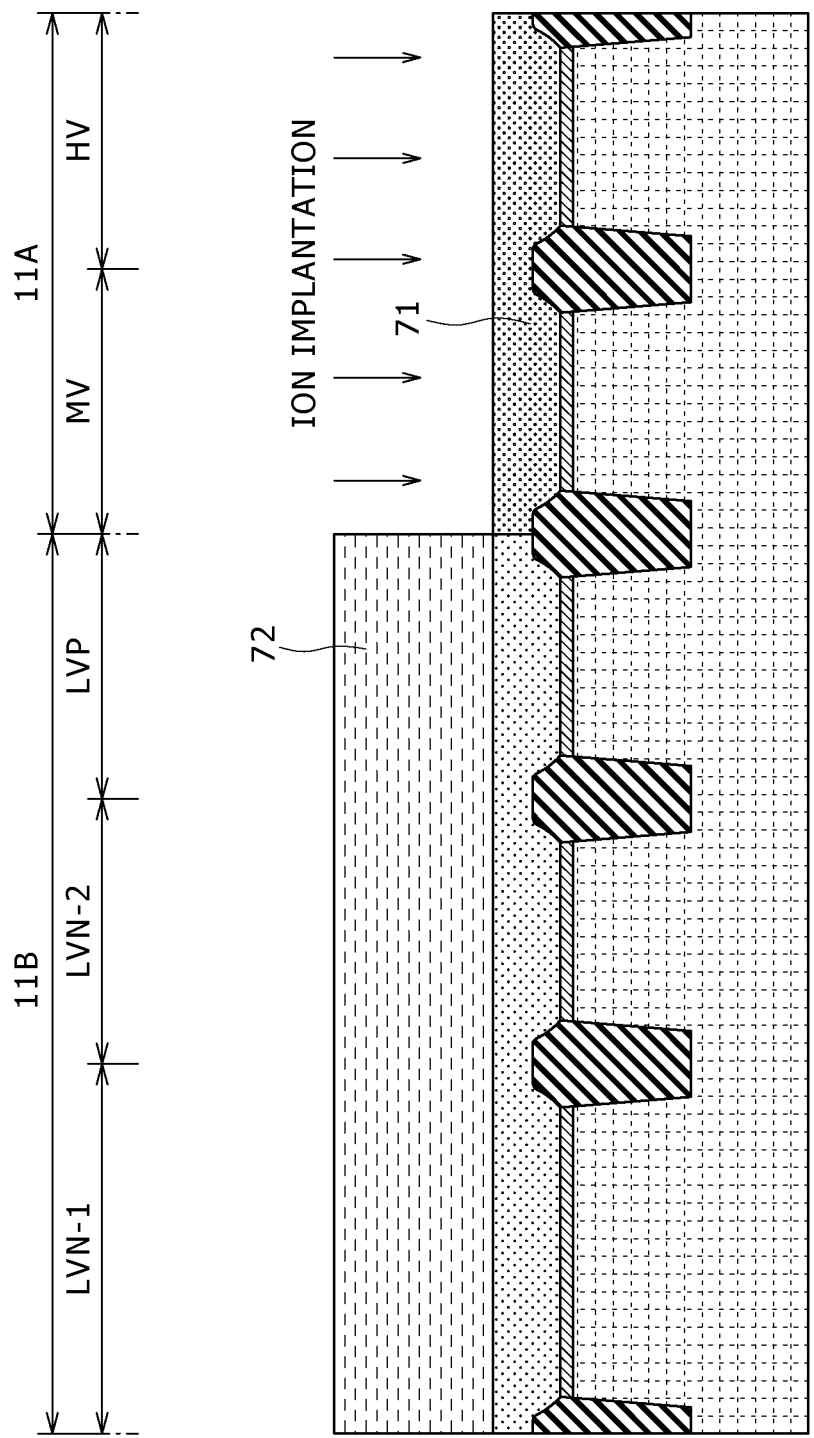

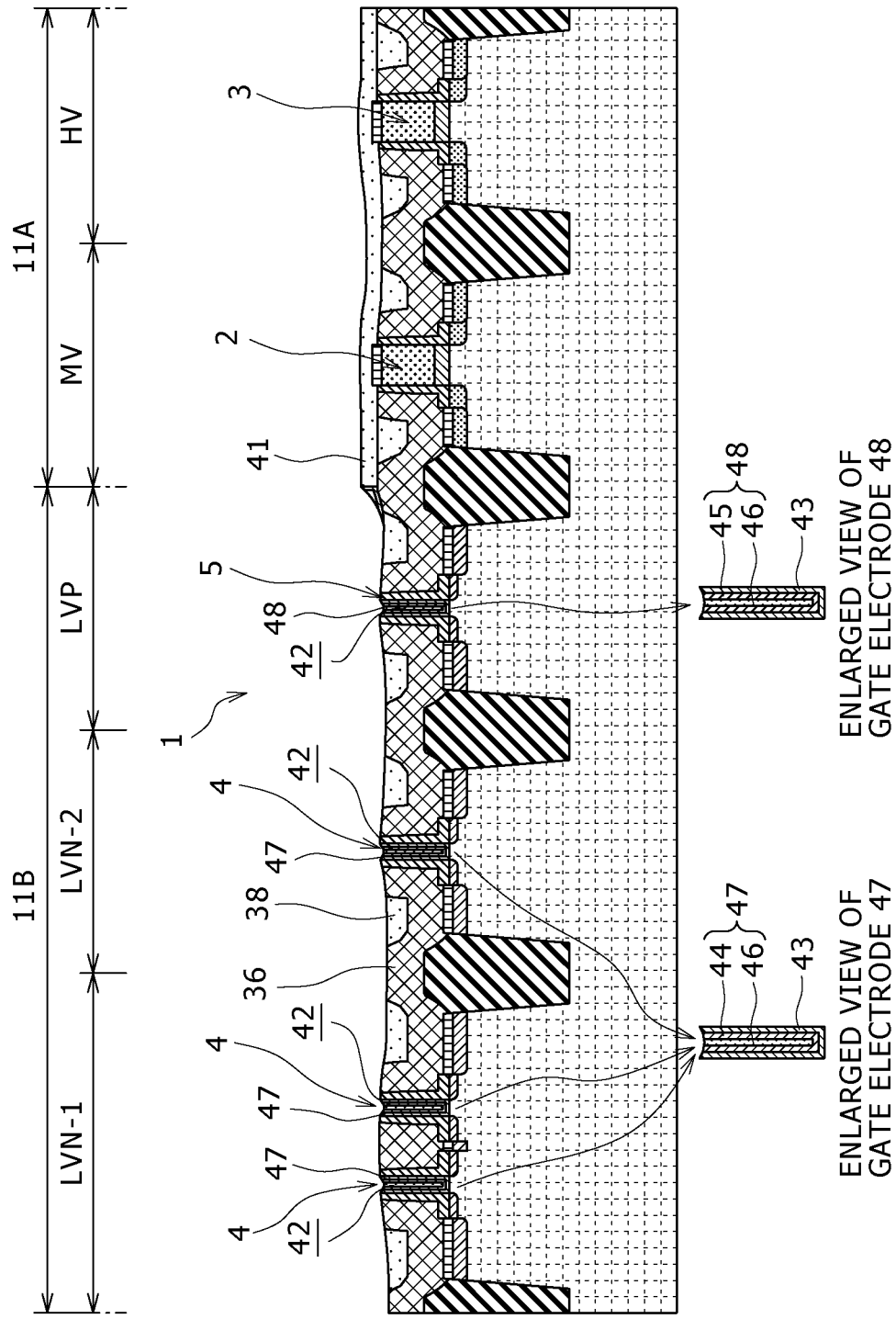

METHOD FOR MANUFACTURING SEMICONDUCTOR DEVICE

CROSS REFERENCES TO RELATED APPLICATIONS

The present invention contains subject matter related to Japanese Patent Application JP 2007-204835 filed in the Japan Patent Office on Aug. 7, 2007, the entire contents of which being incorporated herein by reference.

BACKGROUND OF THE INVENTION

1. Field of the Invention

The present invention relates to a method for manufacturing a semiconductor device in which transistors whose application voltages are different from each other are provided in a mixed manner.

2. Description of Related Art

For a related-art CMIS transistor, polysilicon (poly-Si) is generally used as its gate electrode. The current drive capability Ids of the CMIS transistor is represented by Equation (1) in general.

$$I_{on} = I_{ds} = \mu_{\mathit{eff}} \times C_{ox} \times \frac{W}{L} \times \frac{(V_g - V_{th})^2}{2m} \quad (1)$$

Actually the capacitance of polysilicon as the gate material is also included in the capacitance Cox of the gate insulating film. This lowers the current drive capability Ids, which results in a long circuit delay time T as shown in Equation (2).

$$\tau = \frac{CV}{I} = (C_{Tr} + C_{Mtl})\frac{V_{dd}}{I_{on}} \quad (2)$$

Because of this background, a metal gate, in which no depletion layer is generated, is used as the gate. For example, for a high-speed, low-power-consumption MIS transistor, studies are being made about use of a gate stack structure composed of a gate insulating film having a dielectric constant higher than that of silicon oxide and a metal gate (hereinafter, referred to as "high dielectric constant film/metal gate"). However, in a normal manufacturing method, the thermal history after the formation of the high dielectric constant film/metal gate includes high temperatures, which leads to problems of the deterioration of the characteristics and reliability of the high dielectric constant insulating film and the shift of the work function of the metal gate from the design value.

To avoid these problems, a buried gate (e.g. damascene gate) structure obtained through the completion of the major heat treatment steps necessary to form the transistor before the formation of the high dielectric constant film/metal gate has been proposed (refer to e.g. Japanese Patent Laid-open No. 2001-102443). For example, if a metal electrode is used, this structure is obtained by a method in which initially a transistor structure is formed by using a silicon oxide gate insulating film and a polysilicon gate electrode, and thereafter the gate insulating film and the gate electrode part are removed and then a metal oxide film and a metal electrode are newly buried. In this method, the heat treatment necessary to form the transistor is completed before the formation of the metal electrode, and therefore the deterioration of the metal electrode does not occur.

Another method has also been proposed. In this method, in order to prevent a polysilicon gate electrode from being polished at the time of metal polishing by chemical mechanical polishing (CMP), the height of a damascene gate electrode for high-speed and low-voltage operation is set larger than that of the polysilicon gate electrode for high-breakdown-voltage operation at the timing when the damascene gate is processed (refer to e.g. Japanese Patent Laid-open No. 2004-6475).

However, an actual semiconductor device includes both a transistor that is required to operate at high speed/low power consumption and employs a metal oxide film and a metal electrode and a transistor that operates with high voltage and employs a related-art silicon oxide gate insulating film and a related-art polysilicon gate electrode. Therefore, on the same chip, a damascene gate structure having high dielectric constant film/metal gate for high-speed and low-voltage operation and a gate structure having a thicker gate insulating film for high-breakdown-voltage operation need to be formed on the same substrate in a mixed manner.

With reference to the manufacturing-step sectional views of FIGS. 4A to 4M, a description will be made below about one example of a method for manufacturing a semiconductor device that includes both a transistor that is obtained through the completion of the heat treatment necessary to form the transistor before formation of a metal electrode and employs a metal oxide film and the metal electrode and a transistor that operates with high voltage and employs a related-art silicon oxide gate insulating film and a related-art polysilicon gate electrode.

Referring to FIG. 4A, element isolation regions 12 that isolate areas LVN-1, LVN-2, LVP, MV, and HV from each other are formed in a semiconductor substrate 11 by carrying out an element isolation step. In the areas LVN-1, LVN-2, and LVP, low-voltage transistors (e.g. MISFETs) are to be formed. In the area MV, a middle-voltage transistor (e.g. MISFET) is to be formed. In the area HV, a high-voltage transistor (e.g. MISFET) is to be formed. The areas MV and HV include both an area in which the MISFET pattern density will be high and an area that will have an isolated MISFET pattern. The area HV, in which the high-voltage transistor is to be formed, and the area MV, in which the middle-voltage transistor is to be formed, are defined as a first area 11A. The area LVN-1, in which NMISFETs as the low-voltage transistors are to be formed with high density, the area LVN-2, in which an NMISFET as the low-voltage transistor is to be formed in an isolated manner, and the area LVP, in which a PMISFET as the low-voltage transistor is to be formed, are defined as a second area 11B.

Subsequently, ion implantation for forming P-well regions (not shown) in the areas in which the NMISFETs are to be formed, ion implantation for forming buried layers (not shown) for preventing punch-through of the MISFETs, and ion implantation for adjusting the threshold voltage (Vth) are adequately performed, to thereby form NMIS channel regions. In addition, ion implantation for forming N-well regions (not shown) in the areas in which the PMISFETs are to be formed, ion implantation for forming buried layers (not shown) for preventing punch-through of the MISFETs, and ion implantation for adjusting the threshold voltage (Vth) are adequately performed, to thereby form PMIS channel regions. The ion implantation may be performed with different ion implantation conditions that each correspond to a respective one of the area HV, in which the high-voltage transistor is to be formed, the area MV, in which the middle-voltage transistor is to be formed, and the areas LVN-1, LVN-2, and LVP, in which the respective low-voltage transistors are to be formed.

Subsequently, a gate insulating film 13 is formed on the surfaces of the area HV and the area MV of the semiconductor substrate 11. The high-voltage transistor and the middle-voltage transistor frequently have a thick gate insulating film, and the gate insulating film 13 is formed by using e.g. a silicon oxide film. This silicon oxide film is formed by e.g. thermal oxidation at a temperature in the range of 750° C. to 900° C., and the thickness thereof is in the range of 2 nm to 4 nm. In the formation of the gate insulating film 13, the gate insulating film 13 is formed also above the active regions in the second area 11B simultaneously. This gate insulating film 13 in the second area 11B is used as a dummy gate insulating film 14.

Subsequently, a gate forming step is carried out. Initially, an electrode forming film for forming first gate electrodes and dummy gate electrodes is formed on the gate insulating film 13 and the dummy gate insulating film 14. This electrode forming film is formed by depositing e.g. polysilicon or amorphous silicon over the entire surface with the intermediary of the gate insulating film 13 and the dummy gate insulating film 14 on the semiconductor substrate 11. For example, if the electrode forming film is formed by using polysilicon, low-pressure CVD in which e.g. monosilane ($SiH_4$) is the source gas and the deposition temperature is in the range of 580° C. to 620° C. is used to deposit polysilicon to a thickness in the range of 100 nm to 150 nm. Subsequently, an ion implantation step for reducing the gate resistance is carried out for the partial portion of the electrode forming film in the first area 11A.

Subsequently, a hard mask layer is formed on the electrode forming film. This hard mask layer is formed by depositing silicon nitride (SiN) to a thickness in the range of e.g. 50 nm to 100 nm by e.g. low-pressure CVD (LP-CVD).

Subsequently, a resist pattern (not shown) for forming the first gate electrodes and the dummy gate electrodes is formed over the electrode forming film by resist coating and a lithography technique, and then the hard mask layer is processed by e.g. anisotropic etching with use of the resist pattern as the etching mask. Thereby, hard masks 74A for forming first gate electrodes 15 of the high-voltage transistor and the middle-voltage transistor in the first area 11A, and hard masks 74B for forming second gate electrodes of the low-voltage transistors in the second area 11B are formed. In this anisotropic etching, a gas based on e.g. hydrogen bromide (HBr) or chlorine (Cl) is used as the etching gas. Furthermore, by using the hard masks 74A and 74B as an etching mask, the first gate electrodes 15 are formed in the first area 11A, and simultaneously dummy gate electrodes 16 are formed in the second area 11B. At this time, the gate insulating film 13 and the dummy gate insulating film 14 are also etched.

Subsequently, an insulating film for forming offset spacers is so formed over the semiconductor substrate 11 by e.g. low-pressure CVD as to cover gate parts 17 composed of the hard masks 74A, the first gate electrodes 15, and the gate insulating film 13 and dummy gate parts 18 composed of the hard masks 74B, the dummy gate electrodes 16, and the dummy gate insulating film 14. This insulating film is formed by using a silicon nitride film by e.g. low-pressure CVD. Subsequently, the offset spacers (not shown) are formed by etching back the insulating film for the entire surface. The thickness of the silicon nitride film deposited by low-pressure CVD is in the range of e.g. 6 nm to 10 nm.

Subsequently, an ion implantation mask (not shown) is formed over the semiconductor substrate 11 in the second area 11B. This ion implantation mask is formed e.g. by forming a resist film across the entire surface by a resist coating technique and then processing the resist film by a lithography technique in such a way that the first area 11A is exposed and the second area 11B is covered. Subsequently, ion implantation into the semiconductor substrate 11 is performed with use of this resist film as the ion implantation mask, to thereby form extension regions 21 and 22 in the vicinity of the surface of the semiconductor substrate 11 and on the sides of the respective gate parts 17 in the first area 11A. If there is a need to fabricate both an NMISFET and a PMISFET in the first area 11A, different ion implantation masks that each correspond to a respective one of the NMISFET area and the PMISFET area are separately formed and different kinds of ion implantation that each correspond to a respective one of the MISFETs are carried out. After the ion implantation, the ion implantation mask is removed.

Subsequently, another ion implantation mask (not shown) is formed over the semiconductor substrate 11. This ion implantation mask is formed e.g. by forming a resist film across the entire surface by a resist coating technique and then processing the resist film by a lithography technique in such a way that the areas LVN-1 and LVN-2 of the second area 11B are exposed and the first area 11A and the area LVP are covered. Ion implantation into the semiconductor substrate 11 is performed with use of this ion implantation mask (not shown), to thereby form extension regions 23 and 24 of the NMISFETs in the vicinity of the surface of the semiconductor substrate 11 and on the sides of the respective dummy gate parts 18 in the areas LVN-1 and LVN-2. Thereafter, the ion implantation mask is removed.

Subsequently, yet another ion implantation mask (not shown) is formed over the semiconductor substrate 11. This ion implantation mask is formed e.g. by forming a resist film across the entire surface by a resist coating technique and then processing the resist film by a lithography technique in such a way that the area LVP is exposed and the areas LVN-1 and LVN-2 of the second area 11B and the first area 11A are covered. Ion implantation into the semiconductor substrate 11 is performed with use of this ion implantation mask, to thereby form extension regions 25 and 26 of the PMISFET in the vicinity of the surface of the semiconductor substrate 11 and on the sides of the dummy gate part 18 in the area LVP. Thereafter, the ion implantation mask is removed.

In the above-described respective ion implantation steps, the gate parts 17, the dummy gate parts 18, and the offset spacers (not shown) also serve as the ion implantation mask. In this manner, both the NMISFETs and the PMISFET are fabricated in the second area 11B. The order of the formation of the extension regions 21 and 22, the extension regions 23 and 24, and the extension regions 25 and 26 may be any order.

Subsequently, an insulating film for forming sidewalls is so formed over the semiconductor substrate 11 by e.g. low-pressure CVD as to cover the gate parts 17, the dummy gate parts 18, and the offset spacers (not shown). This insulating film is formed by low-pressure CVD by using e.g. a multi-layer film composed of a silicon nitride film (with a thickness in the range of e.g. 15 nm to 30 nm) and a TEOS (Tetra Ethyl Ortho Silicate) film (with a thickness in the range of e.g. 40 nm to 60 nm). Subsequently, sidewalls 20 are formed by etching back the insulating film for the entire surface.

Subsequently, sources/drains are formed. Specifically, an ion implantation mask (not shown) is formed over the semiconductor substrate 11 in the second area 11B. This ion implantation mask is formed e.g. by forming a resist film across the entire surface by a resist coating technique and then processing the resist film by a lithography technique in such a way that the first area 11A is exposed and the second area 11B is covered. Subsequently, ion implantation into the semiconductor substrate 11 is performed with use of this resist film as the ion implantation mask, to thereby form source/drain regions 27 and 28 in the vicinity of the surface of the semiconductor substrate 11 and on the sides of the respective gate parts 17 in the first area 11A, with the intermediary of the extension regions 21 and 22 between the source/drain regions 27 and 28. In this ion implantation, the gate parts 17 and the sidewalls 20 (including the offset spacers) also serve as the ion implantation mask. After the ion implantation, the ion implantation mask is removed.

Similarly, another ion implantation mask (not shown) is formed over the semiconductor substrate 11 in the first area 11A and the area LVP of the second area 11B. This ion implantation mask is formed e.g. by forming a resist film across the entire surface by a resist coating technique and then processing the resist film by a lithography technique in such a way that the areas LVN-1 and LVN-2 of the second area 11B are exposed and the first area 11A and the area LVP of the second area 11B are covered. Subsequently, ion implantation into the semiconductor substrate 11 is performed with use of this resist film as the ion implantation mask, to thereby form source/drain regions 29 and 30 in the vicinity of the surface of the semiconductor substrate 11 and on the sides of the respective dummy gate parts 18 in the areas LVN-1 and LVN-2 of the second area 11B, with the intermediary of the extension regions 23 and 24 between the source/drain regions 29 and 30. In this ion implantation, the dummy gate parts 18 and the sidewalls 20 (including the offset spacers) also serve as the ion implantation mask. After the ion implantation, the ion implantation mask is removed.

Similarly, yet another ion implantation mask (not shown) is formed over the semiconductor substrate 11 in the first area 11A and the areas LVN-1 and LVN-2 of the second area 11B. This ion implantation mask is formed e.g. by forming a resist film across the entire surface by a resist coating technique and then processing the resist film by a lithography technique in such a way that the area LVP of the second area 11B is exposed and the first area 11A and the areas LVN-1 and LVN-2 of the second area 11B are covered. Subsequently, ion implantation into the semiconductor substrate 11 is performed with use of this resist film as the ion implantation mask, to thereby form source/drain regions 31 and 32 in the vicinity of the surface of the semiconductor substrate 11 and on the sides of the dummy gate part 18 in the area LVP of the second area 11B, with the intermediary of the extension regions 25 and 26 between the source/drain regions 31 and 32. In this ion implantation, the dummy gate part 18 and the sidewalls 20 (including the offset spacers) also serve as the ion implantation mask. After the ion implantation, the ion implantation mask is removed.

In this manner, both the NMISFETs and the PMISFET are fabricated in the second area 11B. The order of the above-described ion implantation steps is not limited to the above-described order, but any of the source/drain regions 27 and 28 in the first area, the source/drain regions 29 and 30 in the areas LVN-1 and LVN-2, and the source/drain regions 31 and 32 in the area LVP may be formed first or last.

Subsequently, the TEOS portion of the sidewalls 20 is removed. For this removal, e.g. wet etching with a diluted hydrofluoric acid is used. Thereafter, heat treatment for activating the implanted ions is performed. For example, by this heat treatment, the impurities are activated under a condition of 1000° C. and five seconds, so that the source/drain regions 27 to 32 of the respective MISFETs are formed. It is also possible to perform the heat treatment by spike RTA for the purpose of promoting the dopant activation and suppressing diffusion.

Subsequently, a silicide layer 33 is formed on the respective source/drain regions 27 to 32. Initially, a metal layer for forming silicide is formed over the entire surface. In the present example, cobalt (Co) is used for the metal layer as one example. The metal layer is formed by deposing cobalt to a thickness in the range of e.g. 6 nm to 8 nm by e.g. sputtering. Subsequently, RTA is performed at a temperature in the range of 500° C. to 600° C. to thereby form the silicide layer 33 through the reaction of only the metal layer on silicon (Si) of the semiconductor substrate 11. Because the metal layer is composed of cobalt, the silicide layer 33 is obtained as a cobalt silicide (e.g. CoSi) layer. Thereafter, the unreacted cobalt on the insulating films (e.g. the element isolation regions 12, the hard masks 74A and 74B, and the sidewalls 20) is removed by wet etching with a mixed liquid of sulfuric acid ($H_2SO_4$) and hydrogen peroxide ($H_2O_2$). Subsequently, heat treatment is performed to form lower-resistance cobalt silicide ($CoSi_2$). This heat treatment is performed by e.g. RTA at a temperature in the range of 650° C. to 850° C. for 30 seconds. It is also possible that nickel (Ni) or nickel-platinum (NiPt) is used for the metal layer instead of cobalt (Co) to thereby form nickel silicide ($NiSi_2$). In any case, the RTA temperature can be adequately set.

Subsequently, an insulating film is formed to cover the gate parts 17, the dummy gate parts 18, and so on. As the insulating film, initially a liner film 36 is formed over the entire surface of the semiconductor substrate 11. This liner film 36 is formed of e.g. a silicon nitride (SiN) film, and applies stress on the channel parts of the transistors. For example, for an NMISFET, a film applying tensile stress is used in order to enhance the channel mobility. For a PMISFET, a film applying compressive stress is used in order to enhance the channel mobility. The different liner films 36 may be fabricated for the NMISFETs and the PMISFET. The stress of the liner film 36 can be determined depending on the film deposition condition in general.

Referring next to FIG. 4B, a first interlayer insulating film 38 as a part of the insulating film is formed on the liner film 36. This first interlayer insulating film 38 is formed e.g. by using a silicon oxide ($SiO_2$) film having a thickness in the range of 100 nm to 200 nm by high density plasma (HDP) CVD.

Subsequently, as shown in FIG. 4C, the first interlayer insulating film 38 and the liner film 36 over the gate parts 17 and the dummy gate parts 18 are polished by chemical mechanical polishing (CMP) until the respective hard masks 74A and 74B are exposed.

Subsequently, as shown in FIG. 4D, an etching mask 75 that covers the second area 11B is formed by a resist coating technique and a lithography technique. The hard masks 74A (see FIG. 4C) in the first area 11A are removed with use of this etching mask 75 to thereby expose the upper surfaces of the first gate electrodes 15. At this time, upper parts of the first interlayer insulating film 38 and the liner film 36 are also removed by etching. Thereafter, the etching mask 75 is removed. FIG. 4D shows the state before the etching mask 75 is removed.

Subsequently, as shown in FIG. 4E, a silicide layer 40 is formed on the respective first gate electrodes 15. Initially, a metal layer for forming silicide is formed over the entire surface. In the present example, cobalt (Co) is used for the metal layer as one example. The metal layer is formed by deposing cobalt to a thickness in the range of e.g. 6 nm to 8 nm by e.g. sputtering. Subsequently, RTA is performed at a temperature in the range of 500° C. to 600° C. to thereby form the silicide layer 40 through the reaction of only the metal layer on silicon (Si) of the first gate electrodes 15. Because the metal layer is composed of cobalt, the silicide layer 40 is obtained as a cobalt silicide (e.g. CoSi) layer. Thereafter, the unreacted cobalt on the insulating films (e.g. the sidewalls 20, the liner film 36, the first interlayer insulating film 38, and the hard masks 74B) is removed by wet etching with a mixed liquid of sulfuric acid ($H_2SO_4$) and hydrogen peroxide ($H_2O_2$). Subsequently, heat treatment is performed to form lower-resistance cobalt silicide ($CoSi_2$). This heat treatment is performed by e.g. RTA at a temperature in the range of 650° C. to 850° C. for 30 seconds. It is also possible that nickel (Ni) or nickel-platinum (NiPt) is used for the metal layer instead of cobalt (Co) to thereby form nickel silicide ($NiSi_2$). In any case, the RTA temperature can be adequately set.

Subsequently, as shown in FIG. 4F, a protective film 41 for protecting the silicide layer 40 is formed over the entire surface. This protective film 41 is formed e.g. by using a silicon oxide ($SiO_2$) or silicon nitride (SiN) film by plasma CVD. One example of the CVD condition when the protective film 41 is formed by using a silicon oxide film is as follows: oxygen ($O_2$) (the flow rate is 600 $cm^3$/min) and TEOS (Tetra Ethyl Ortho Silicate) (the flow rate is 800 $cm^3$/min) are used as the source gas; the pressure of the film deposition atmosphere is 1.09 kPa; the RF power of the CVD apparatus is 700 W; and the substrate temperature is 400° C. The protective film 41 can be deposited at a temperature lower than 450° C., and thus damage to the already-formed silicide layers 33 and 40 can be avoided.

Subsequently, an etching mask 76 is so formed by resist coating and a lithography technique as to cover the first area 11A. Therefore, the second area 11B is not covered by this etching mask 76.

Subsequently, as shown in FIG. 4G, the protective film 41 (see FIG. 4F) in the second area 11B is removed by dry etching with use of the etching mask 76 (see FIG. 4F). One example of the dry etching condition is as follows: octafluorocyclobutane ($C_4F_8$), oxygen ($O_2$), and argon (Ar) are used as the etching gas; the flow rates of $C_4F_8$, $O_2$, and Ar are 9 $cm^3$/min, 5 $cm^3$/min, and 250 $cm^3$/min, respectively; the pressure of the etching atmosphere is 4.1 Pa; the power (plasma output) of the etching apparatus is 1500 W; and the substrate temperature is 20° C. Subsequently, the hard masks 74B and the dummy gate electrodes 16 (see FIG. 4A) are removed by e.g. dry etching. Furthermore, the dummy gate insulating film 14 (see FIG. 4A) is removed by wet etching with a diluted hydrofluoric acid, so that gate forming trenches 42 are formed. At this time, the first area 11A is covered by the protective film 41. The etching mask 76 is removed before the wet etching.

Subsequently, a second gate insulating film 43 is formed on the inside surfaces of the gate forming trenches 42. This second gate insulating film 43 is so formed that the capacitance of the second gate insulating film 43 per unit area is lower than that of the first gate insulating film 13 in the first area 11A per unit area. The second gate insulating film 43 is formed by using a high dielectric constant film by atomic layer deposition (ALD). The high dielectric constant film is formed by using e.g. oxide, silicate, or oxynitride of hafnium, zirconium, lanthanum, yttrium, tantalum, or aluminum. Specifically, it is formed by using e.g. hafnium oxide ($HfO_2$), zirconium oxide ($ZrO_2$), lanthanum oxide ($LaO_3$), yttrium oxide ($Y_2O_3$), tantalum oxide ($Ta_2O_5$), aluminum oxide ($Al_2O_3$), hafnium silicate ($HfSiO_x$), zirconium silicate ($ZrSiO_x$), lanthanum silicate ($LaSiO_x$), yttrium silicate ($YSiO_x$), tantalum silicate ($TaSiO_x$), aluminum silicate ($AlSiO_x$), zirconium titanate ($ZrTiO_x$), hafnium aluminum oxide ($HfAlO_x$), or hafnium zirconium oxide ($HfZrO_x$), or nitride of any of these compounds. In general, the relative dielectric constant of $HfO_2$ is in the range of 25 to 30 and that of $ZrO_2$ is in the range of 20 to 25, although the relative dielectric constant of the high dielectric constant film changes depending on the composition, the state (crystalline state or amorphous state), and so on.

Subsequently, as shown in FIGS. 4H to 4K, work function control films 44 and 45 that determine work functions are formed over the inside surfaces of the gate forming trenches 42 with the intermediary of the second gate insulating film 43.

Initially, a metal or metal compound having a work function appropriate for the NMISFETs is deposited by a film deposition method such as atomic layer deposition (ALD) or chemical vapor deposition. In general, the gate electrode of an NMISFET has a work function of 4.6 eV or lower, and preferably 4.3 eV or lower. The gate electrode of a PMISFET has a work function of 4.6 eV or higher, and preferably 4.9 eV or higher. It is desirable that the difference in the work function therebetween is equal to or larger than 0.3 eV. Specifically, the work function of $HfSi_x$ for the NMISFETs is in the range of 4.1 to 4.3 eV and that of titanium nitride (TiN) for the PMISFET is in the range of 4.5 to 5.0 eV, although changing depending on the composition, the state (crystalline state or amorphous state), and so on.

Examples of the materials of the work function control films 44 and 45 include metals such as titanium (Ti), vanadium (V), nickel (Ni), zirconium (Zn), niobium (Nb), molybdenum (Mo), ruthenium (Ru), hafnium (Hf), tantalum (Ta), tungsten (W), and platinum (Pt), alloys containing any of these metals, and compounds of these metals. Examples of the metal compounds include metal nitrides and compounds of metal and semiconductor. One example of the compounds of metal and semiconductor is metal silicide.

Examples of the material of the work function control film 44 appropriate for the NMISFETs include metals such as hafnium (Hf) and tantalum (Ta), alloys containing any of these metals, and compounds of these metals. Specifically, hafnium silicide ($HfSi_x$) is preferable. Examples of the material of the work function control film 45 appropriate for the PMISFET include metals such as titanium (Ti), molybdenum (Mo), and ruthenium (Ru), alloys containing any of these metals, and compounds of these metals. Specifically, titanium nitride (TiN) and ruthenium (Ru) are preferable.

In the present example, as shown in FIG. 4H, the work function control film 44 is formed by depositing e.g. hafnium silicide ($HfSi_x$) on the surface of the second gate insulating film 43 to a thickness in the range of e.g. 10 nm to 100 nm.

Subsequently, as shown in FIG. 4I, a resist mask 77 that covers the areas LVN-1 and LVN-2 of the second area 11B is formed by resist coating and a lithography technique. The work function control film 44 in the area LVP and the first area 11A is etched by using this resist mask 77 as the etching mask. As a result, as shown in FIG. 4J, the work function control film 44 in the area LVP and the first area 11A is removed, whereas the work function control film 44 is left in the areas LVN-1 and LVN-2 of the second area 11B. Thereafter, the resist mask 77 is removed.

Subsequently, as shown in FIG. 4K, a metal or metal compound having a work function appropriate for the PMISFET is deposited by a film deposition method such as atomic layer deposition (ALD) or chemical vapor deposition. In the present example, initially the work function control film 45 is formed by depositing e.g. titanium nitride (TiN) to a thickness in the range of 5 nm to 50 nm on the surfaces of the second gate insulating film 43 and the work function control film 44. Subsequently, a resist mask (not shown) that covers the area LVP of the second area 11B is formed by resist coating and a lithography technique. The work function control film 45 in the areas LVN-1 and LVN-2 of the second area 11B and the first area 11A is etched by using this resist mask as the etching mask. As a result, the work function control film 45 in the areas LVN-1 and LVN-2 of the second area 11B and the first area 11A is removed, whereas the work function control film 45 is left in the area LVP of the second area 11B. It is also possible to deposit e.g. ruthenium (Ru) for the PMISFET. Thereafter, the resist mask is removed.

In the case of the above-described steps, it does not matter which of the work function control films 44 and 45 is formed first. If the work function control film 45 is left across the entire surface, the work function control film 44 may be formed before the formation of the work function control film 45.

Subsequently, as shown in FIG. 4L, a conductive film 46 composed of an electrically-conductive material is formed to fill the insides of the gate forming trenches 42. This conductive film 46 is formed by using e.g. a metal material whose electric resistance is lower than those of the work function control films 44 and 45. In the present example, tungsten (W) is used as one example. This tungsten film is formed through deposition by e.g. CVD. The conductive film 46 has a thickness that allows the gate forming trenches 42 to be completely filled. For example, the thickness is in the range of 200 nm to 400 nm.

Subsequently, as shown in FIG. 4M, the excess conductive film 46 (see FIG. 4L) outside the gate forming trenches 42 is removed. For this removal processing, e.g. chemical mechanical polishing (CMP) is used. In this CMP, the liner film 36, the first interlayer insulating film 38, the protective film 41, and so on serve as the polishing stopper. As a result of the CMP step, second gate electrodes 47 of the low-voltage transistors (NMISFETs) in the second area 11B are formed by the conductive film 46 and the work function control film 44 left in the gate forming trenches 42. Furthermore, a second gate electrode 48 of the low-voltage transistor (PMISFET) is formed by the conductive film 46 and the work function control film 45 left in the gate forming trench 42.

Thereafter, although not shown in the drawing, a second interlayer insulating film is formed across the entire surface over the liner film 36, the first interlayer insulating film 38, and the protective film 41, and then a wiring step is carried out.

In this way, a semiconductor device 1 is formed. In the semiconductor device 1, a middle-voltage transistor (NMISFET) 2 is formed in the area MV of the first area 11A, and a high-voltage transistor (NMISFET) 3 is formed in the area HV. Furthermore, low-voltage transistors (NMISFETs) 4 are formed with high density in the area LVN-1 of the second area 11B, and the low-voltage transistor (NMISFET) 4 is formed in an isolated manner in the area LVN-2. In addition, a low-voltage transistor (PMISFET) 5 is formed in the area LVP.

The above-described manufacturing method is very complex. Moreover, as shown in FIG. 4M, a step due to the protective film 41 is generated between the area LVP and the area MV, for example, because of the manufacturing steps. Thus, there is a high possibility that a residue of the conductive film 46 is left near the step formed at an end of the protective film 41 after the polishing of the conductive film 46. To eliminate this residue, excess polishing needs to be performed. However, if the excess polishing is performed, the second gate electrodes 47 and 48, which are metal gates, will be excessively polished. This makes it difficult to fabricate the second gate electrodes 47 and 48 in accordance with the design values. Furthermore, the excess polishing increases the degree of the surface irregularity, which makes it difficult to obtain an ideal shape, e.g., a flat shape.

SUMMARY OF THE INVENTION

Thus, the problem that should be solved is involved in the method for manufacturing a semiconductor device that has, on the same semiconductor substrate, transistor groups of different operating voltages, such as a low-voltage-operating transistor group whose gate electrodes are formed of metal gate electrodes and a high-breakdown-voltage (high-voltage-operating) transistor group whose gate electrodes have a silicide layer for achieving lower resistance. Specifically, the problem is that, at the time of formation of the metal gate electrodes in this method, a residue of an electrically-conductive film serving as the metal gate electrodes is left near a step that is generated on the underlying layer before the formation of the electrically-conductive film.

There is a need for the present invention to form a low-voltage-operating transistor group and a high-breakdown-voltage (high-voltage-operating) transistor group on the same semiconductor substrate, while allowing decrease in the resistance of the gate electrodes of the high-breakdown-voltage transistor group and forming an electrically-conductive film for forming metal gate electrodes on a flat underlying layer to thereby allow prevention of the occurrence of a residue of the conductive film.

According to an embodiment of the present invention, there is provided a method for manufacturing a semiconductor device that has on a semiconductor substrate a first transistor group and a second transistor group whose operating voltage is lower than an operating voltage of the first transistor group, the first transistor group having a first gate electrode formed over the semiconductor substrate with intermediary of a first gate insulating film and a silicide layer formed on the first gate electrode, the second transistor group having a second gate electrode formed with intermediary of a second gate insulating film in a gate forming trench that is formed by removing a dummy gate part formed over the semiconductor substrate. The method includes the steps of: forming the silicide layer on the first gate electrode of the first transistor group after setting a height of the first gate electrode smaller than a height of a dummy gate electrode formed in the dummy gate part; and forming the gate forming trench by removing the dummy gate part after forming an interlayer insulating film that covers the silicide layer and planarizing a surface of the interlayer insulating film.

According to the above-described embodiment of the present invention, a residue of a metal material is not generated even when a first transistor group (high-breakdown-voltage (high-voltage-operating, middle-voltage-operating) transistor group) that has a gate insulating film 13 composed of silicon oxide or silicon oxynitride and first gate electrodes 15 composed of polysilicon or amorphous silicon and a second transistor group (e.g. low-voltage-operating transistor group) that has a gate insulating film 43 formed of a high dielectric constant (High-k) film and second gate electrodes 47 and 48 as so-called metal gate electrodes are formed on the same semiconductor substrate 11. This feature provides advantages that the interconnect reliability can be enhanced and the resistance of the first gate electrodes 15 of the first transistor group can be decreased.

BRIEF DESCRIPTION OF THE DRAWINGS

FIGS. 1A to 1M are manufacturing-step sectional views showing a method for manufacturing a semiconductor device according to one embodiment (first embodiment) of the present invention;

FIGS. 2A to 2C are manufacturing-step sectional views showing a method for manufacturing a semiconductor device according to one embodiment (second embodiment) of the present invention;

FIGS. 4A to 4M are manufacturing-step sectional views showing one example of a related-art method for manufacturing a semiconductor device.

DETAILED DESCRIPTION OF THE PREFERRED EMBODIMENTS

A method for manufacturing a semiconductor device according to one embodiment (first embodiment) of the present invention will be described below with reference to the manufacturing-step sectional views of FIGS. 1A to 1M. This manufacturing method of the first embodiment is one example of a method for manufacturing the above-described semiconductor device 1.

Figure 1A:
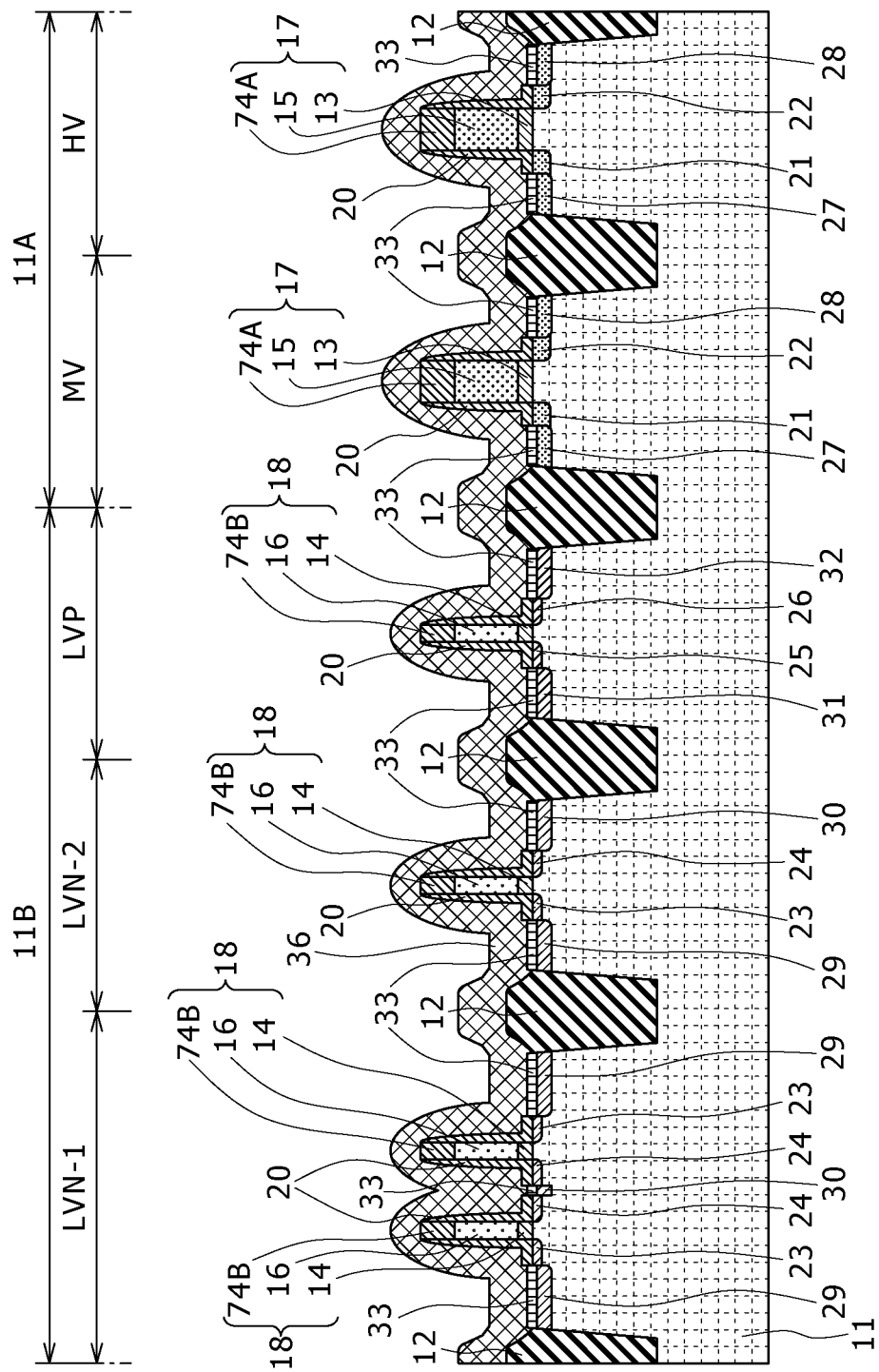

Referring to FIG. 1A, a silicon semiconductor substrate is used as a semiconductor substrate 11. An element isolation step is carried out for the semiconductor substrate 11 to thereby form element isolation regions 12 that isolate areas LVN-1, LVN-2, LVP, MV, and HV from each other. In the areas LVN-1, LVN-2, and LVP, low-voltage transistors (e.g. MISFETs) are to be formed. In the area MV, a middle-voltage transistor (e.g. MISFET) is to be formed. In the area HV, a high-voltage transistor (e.g. MISFET) is to be formed. The areas MV and HV include both an area in which the MISFET pattern density will be high and an area that will have an isolated MISFET pattern. The area HV, in which the high-voltage transistor is to be formed, and the area MV, in which the middle-voltage transistor is to be formed, are defined as a first area 11A. The area LVN-1, in which NMISFETs as the low-voltage transistors are to be formed with high density, the area LVN-2, in which an NMISFET as the low-voltage transistor is to be formed in an isolated manner, and the area LVP, in which a PMISFET as the low-voltage transistor is to be formed, are defined as a second area 11B.

In the respective embodiments to be described below in the present specification, the respective transistors are defined as follows as one example: the low-voltage transistor refers to a transistor whose operating voltage is lower than 1.5 V; the middle-voltage transistor refers to a transistor whose operating voltage is equal to or higher than 1.5 V and lower than 3.3 V; and the high-voltage (high-breakdown-voltage) transistor refers to a transistor whose operating voltage is equal to or higher than 3.3 V.

One example of the method for forming the element isolation regions 12 is as follows. Initially, a silicon oxide ($SiO_2$) film and a silicon nitride (SiN) film are deposited over the semiconductor substrate 11. The silicon oxide ($SiO_2$) film is formed by e.g. dry oxidation. The silicon nitride (SiN) film is formed by e.g. low-pressure CVD.

Subsequently, a resist pattern is formed for the part in which active regions are to be formed, and then the silicon nitride film, the silicon oxide film, and the semiconductor substrate 11 are sequentially etched with use of the resist pattern as the mask, to thereby form trenches (trench regions). Specifically, the trenches are formed by etching the semiconductor substrate 11 to a depth in the range of e.g. 200 nm to 400 nm. The partial portions of the semiconductor substrate 11 under the areas in which the silicon nitride film is left will serve as the active regions, and a field oxide film is formed in the trench parts, which forms the element isolation regions 12.

The field oxide film is formed by filling the insides of the trenches with silicon oxide ($SiO_2$). By carrying out the filling by e.g. high density plasma CVD (the deposition temperature is in the range of e.g. 650° C. to 700° C.), a dense film with favorable step coverage can be formed. Before the filling with silicon oxide, a silicon oxide film may be formed on the inside surfaces of the trenches by thermal oxidation.

Subsequently, planarization is carried out by polishing the deposited excess silicon oxide by chemical mechanical polishing (CMP). The planarization polishing is carried out until the silicon oxide film on the silicon nitride film can be removed. It is also possible to remove the silicon oxide above wide active regions in advance by lithography patterning and etching in order to reduce the global level difference in the CMP.

Subsequently, the silicon nitride film is removed. For this removal processing, e.g. wet etching with a hot phosphoric acid is used. In this way, the regions in the semiconductor substrate 11 isolated from each other by the element isolation regions 12 will serve as the active regions.

There is also a method in which annealing is performed in nitrogen ($N_2$), in oxygen ($O_2$), or in hydrogen ($H_2$) and oxygen ($O_2$) before the removal of the silicon nitride (SiN) film for the purpose of densification of the silicon oxide ($SiO_2$) film and rounding of corner parts of the active regions. Subsequently, the surfaces of the active regions are oxidized to a thickness in the range of e.g. 8 nm to 10 nm.

Subsequently, ion implantation for forming P-well regions (not shown) in the areas in which the NMISFETs are to be formed, ion implantation for forming buried layers (not shown) for preventing punch-through of the MISFETs, and ion implantation for adjusting the threshold voltage (Vth) are adequately performed, to thereby form NMIS channel regions. In addition, ion implantation for forming N-well regions (not shown) in the areas in which the PMISFETs are to be formed, ion implantation for forming buried layers (not shown) for preventing punch-through of the MISFETs, and ion implantation for adjusting the threshold voltage (Vth) are adequately performed, to thereby form PMIS channel regions. The ion implantation may be performed with different ion implantation conditions that each correspond to a respective one of the area HV, in which the high-voltage transistor is to be formed, the area MV, in which the middle-voltage transistor is to be formed, and the areas LVN-1, LVN-2, and LVP, in which the respective low-voltage transistors are to be formed.

Subsequently, a gate insulating film 13 is formed on the surfaces of the area HV and the area MV of the semiconductor substrate 11. The high-voltage transistor and the middle-voltage transistor frequently have a thick gate insulating film, and the gate insulating film 13 is formed by using e.g. a silicon oxide film. This silicon oxide film is formed by e.g. thermal oxidation at a temperature in the range of 750° C. to 900° C., and the thickness thereof is in the range of 2 nm to 4 nm. In the formation of the gate insulating film 13, the gate insulating film 13 is formed also above the active regions in the second area 11B simultaneously. This gate insulating film 13 in the second area 11B is used as a dummy gate insulating film 14.

Subsequently, an electrode forming film for forming first gate electrodes and dummy gate electrodes is formed on the gate insulating film 13 and the dummy gate insulating film 14. This electrode forming film is formed by depositing e.g. polysilicon or amorphous silicon over the entire surface with the intermediary of the gate insulating film 13 and the dummy gate insulating film 14 on the semiconductor substrate 11. For example, if the electrode forming film is formed by using polysilicon, low-pressure CVD in which e.g. monosilane ($SiH_4$) is the source gas and the deposition temperature is in the range of 580° C. to 620° C. is used to deposit polysilicon to a thickness in the range of 100 nm to 150 nm. Subsequently, an ion implantation step for reducing the gate resistance is carried out for the partial portion of the electrode forming film in the first area 11A.

Subsequently, a hard mask layer is formed on the electrode forming film. This hard mask layer is formed by depositing silicon nitride (SiN) to a thickness in the range of e.g. 50 nm to 100 nm by e.g. low-pressure CVD (LP-CVD). Subsequently, a resist pattern (not shown) for forming the first gate electrodes and the dummy gate electrodes is formed over the electrode forming film by resist coating and a lithography technique, and then the hard mask layer is processed by e.g. anisotropic etching with use of the resist pattern as the etching mask. Thereby, hard masks 74A for forming the first gate electrodes of the high-voltage transistor and the middle-voltage transistor in the first area 11A, and hard masks 74B for forming second gate electrodes of the low-voltage transistors in the second area 11B are formed. In this anisotropic etching, a gas based on e.g. hydrogen bromide (HBr) or chlorine (Cl) is used as the etching gas. Furthermore, by using the hard masks 74A and 74B as an etching mask, first gate electrodes 15 are formed in the first area 11A, and simultaneously dummy gate electrodes 16 are formed in the second area 11B. At this time, the gate insulating film 13 and the dummy gate insulating film 14 are also etched, while the films 13 and 14 under the first gate electrodes 15 and the dummy gate electrodes 16 are left. It is also possible to form the dummy gate electrodes 16 having small width by decreasing the width of the resist pattern through e.g. trimming treatment with oxygen plasma after the formation of the resist pattern. For example, for the 32-nm node technique, even gates having a gate length in the range of about 20 nm to 30 nm can be formed.

Subsequently, an insulating film for forming offset spacers is so formed over the semiconductor substrate 11 by e.g. low-pressure CVD as to cover gate parts 17 composed of the hard masks 74A, the first gate electrodes 15, and the gate insulating film 13 and dummy gate parts 18 composed of the hard masks 74B, the dummy gate electrodes 16, and the dummy gate insulating film 14. This insulating film is formed by using a silicon nitride film by e.g. low-pressure CVD. Subsequently, the offset spacers (not shown) are formed by etching back the insulating film for the entire surface. The thickness of the silicon nitride film deposited by low-pressure CVD is in the range of e.g. 6 nm to 10 nm.

Subsequently, an ion implantation mask (not shown) is formed over the semiconductor substrate 11 in the second area 11B. This ion implantation mask is formed e.g. by forming a resist film across the entire surface by a resist coating technique and then processing the resist film by a lithography technique in such a way that the first area 11A is exposed and the second area 11B is covered. Subsequently, ion implantation into the semiconductor substrate 11 is performed with use of this ion implantation mask, to thereby form extension regions 21 and 22 in the vicinity of the surface of the semiconductor substrate 11 and on the sides of the respective gate parts 17 in the first area 11A. If there is a need to fabricate both an NMISFET and a PMISFET in the first area 11A, different ion implantation masks that each correspond to a respective one of the NMISFET area and the PMISFET area are separately formed and different kinds of ion implantation that each correspond to a respective one of the MISFETs are carried out. After the ion implantation, the ion implantation mask is removed.

Subsequently, another ion implantation mask (not shown) is formed over the semiconductor substrate 11. This ion implantation mask is formed e.g. by forming a resist film across the entire surface by a resist coating technique and then processing the resist film by a lithography technique in such a way that the areas LVN-1 and LVN-2 of the second area 11B are exposed and the first area 11A and the area LVP are covered. Ion implantation into the semiconductor substrate 11 is performed with use of this ion implantation mask, to thereby form extension regions 23 and 24 of the NMISFETs in the vicinity of the surface of the semiconductor substrate 11 and on the sides of the respective dummy gate parts 18 in the areas LVN-1 and LVN-2. After the ion implantation, the ion implantation mask is removed.

Subsequently, yet another ion implantation mask (not shown) is formed over the semiconductor substrate 11. This ion implantation mask is formed e.g. by forming a resist film across the entire surface by a resist coating technique and then processing the resist film by a lithography technique in such a way that the area LVP is exposed and the areas LVN-1 and LVN-2 of the second area 11B and the first area 11A are covered. Ion implantation into the semiconductor substrate 11 is performed with use of this ion implantation mask, to thereby form extension regions 25 and 26 of the PMISFET in the vicinity of the surface of the semiconductor substrate 11 and on the sides of the dummy gate part 18 in the area LVP. Thereafter, the ion implantation mask is removed.

In the above-described respective ion implantation steps, the gate parts 17, the dummy gate parts 18, and the offset spacers (not shown) also serve as the ion implantation mask. In this manner, both the NMISFETs and the PMISFET are fabricated in the second area 11B. The order of the formation of the extension regions 21 and 22, the extension regions 23 and 24, and the extension regions 25 and 26 may be any order.

Subsequently, sidewalls are formed. Initially, an insulating film for forming the sidewalls is so formed over the semiconductor substrate 11 by e.g. low-pressure CVD as to cover the gate parts 17, the dummy gate parts 18, and the offset spacers (not shown). This insulating film is formed by low-pressure CVD by using e.g. a multilayer film composed of a silicon nitride film (with a thickness in the range of e.g. 15 nm to 30 nm) and a TEOS (Tetra Ethyl Ortho Silicate) film (with a thickness in the range of e.g. 40 nm to 60 nm). Subsequently, sidewalls 20 are formed by etching back the insulating film for the entire surface.

Subsequently, an ion implantation mask (not shown) is formed over the semiconductor substrate 11 in the second area 11B. This ion implantation mask is formed e.g. by forming a resist film across the entire surface by a resist coating technique and then processing the resist film by a lithography technique in such a way that the first area 11A is exposed and the second area 11B is covered. Subsequently, ion implantation into the semiconductor substrate 11 is performed with use of this resist film as the ion implantation mask, to thereby form source/drain regions 27 and 28 in the vicinity of the surface of the semiconductor substrate 11 and on the sides of the respective gate parts 17 in the first area 11A, with the intermediary of the extension regions 21 and 22 between the source/drain regions 27 and 28. In this ion implantation, the gate parts 17 and the sidewalls 20 (including the offset spacers) also serve as the ion implantation mask. After the ion implantation, the ion implantation mask is removed.

Similarly, another ion implantation mask (not shown) is formed over the semiconductor substrate 11 in the first area 11A and the area LVP of the second area 11B. This ion implantation mask is formed e.g. by forming a resist film across the entire surface by a resist coating technique and then processing the resist film by a lithography technique in such a way that the areas LVN-1 and LVN-2 of the second area 11B are exposed and the first area 11A and the area LVP of the second area 11B are covered. Subsequently, ion implantation into the semiconductor substrate 11 is performed with use of this resist film as the ion implantation mask, to thereby form source/drain regions 29 and 30 in the vicinity of the surface of the semiconductor substrate 11 and on the sides of the respective dummy gate parts 18 in the areas LVN-1 and LVN-2 of the second area 11B, with the intermediary of the extension regions 23 and 24 between the source/drain regions 29 and 30. In this ion implantation, the dummy gate parts 18 and the sidewalls 20 (including the offset spacers) also serve as the ion implantation mask. After the ion implantation, the ion implantation mask is removed.

Similarly, yet another ion implantation mask (not shown) is formed over the semiconductor substrate 11 in the first area 11A and the areas LVN-1 and LVN-2 of the second area 11B. This ion implantation mask is formed e.g. by forming a resist film across the entire surface by a resist coating technique and then processing the resist film by a lithography technique in such a way that the area LVP of the second area 11B is exposed and the first area 11A and the areas LVN-1 and LVN-2 of the second area 11B are covered. Subsequently, ion implantation into the semiconductor substrate 11 is performed with use of this resist film as the ion implantation mask, to thereby form source/drain regions 31 and 32 in the vicinity of the surface of the semiconductor substrate 11 and on the sides of the dummy gate part 18 in the area LVP of the second area 11B, with the intermediary of the extension regions 25 and 26 between the source/drain regions 31 and 32. In this ion implantation, the dummy gate part 18 and the sidewalls 20 (including the offset spacers) also serve as the ion implantation mask. After the ion implantation, the ion implantation mask is removed.

In this manner, both the NMISFETs and the PMISFET are fabricated in the second area 11B. The order of the above-described ion implantation steps is not limited to the above-described order, but any of the source/drain regions 27 and 28 in the first area, the source/drain regions 29 and 30 in the areas LVN-1 and LVN-2, and the source/drain regions 31 and 32 in the area LVP may be formed first or last.

Subsequently, the TEOS portion of the sidewalls 20 is removed. For this removal, e.g. wet etching with a diluted hydrofluoric acid is used. Thereafter, heat treatment for activating the implanted ions is performed. For example, by this heat treatment, the impurities are activated under a condition of 1000° C. and five seconds, so that the source/drain regions 27 to 32 of the respective MISFETs are formed. It is also possible to perform the heat treatment by spike RTA for the purpose of promoting the dopant activation and suppressing diffusion.

Subsequently, a silicide layer 33 is formed on the respective source/drain regions 27 to 32. Initially, a metal layer for forming silicide is formed over the entire surface. In the present embodiment, cobalt (Co) is used for the metal layer as one example. The metal layer is formed by depositing cobalt to a thickness in the range of e.g. 6 nm to 8 nm by e.g. sputtering. Subsequently, RTA is performed at a temperature in the range of 500° C. to 600° C. to thereby form the silicide layer 33 through the reaction of only the metal layer on silicon (Si) of the semiconductor substrate 11. Because the metal layer is composed of cobalt, the silicide layer 33 is obtained as a cobalt silicide (e.g. CoSi) layer. Thereafter, the unreacted cobalt on the insulating films (e.g. the element isolation regions 12, the hard masks 74A and 74B, and the sidewalls 20) is removed by wet etching with a mixed liquid of sulfuric acid ($H_2SO_4$) and hydrogen peroxide ($H_2O_2$). Subsequently, heat treatment is performed to form lower-resistance cobalt silicide ($CoSi_2$). This heat treatment is performed by e.g. RTA at a temperature in the range of 650° C. to 850° C. for 30 seconds. It is also possible that nickel (Ni) or nickel-platinum (NiPt) is used for the metal layer instead of cobalt (Co) to thereby form nickel silicide ($NiSi_2$). In any case, the RTA temperature can be adequately set.

Subsequently, an insulating film is formed to cover the gate parts 17, the dummy gate parts 18, and so on. As the insulating film, initially a liner film 36 is formed over the entire surface of the semiconductor substrate 11. This liner film 36 is formed of e.g. a silicon nitride (SiN) film, and applies stress on the channel parts of the transistors. For example, for an NMISFET, a film applying tensile stress is used in order to enhance the channel mobility. For a PMISFET, a film applying compressive stress is used in order to enhance the channel mobility. The different liner films 36 may be fabricated for the NMISFETs and the PMISFET. The stress of the liner film 36 can be determined depending on the film deposition condition in general.

Figure 1B:
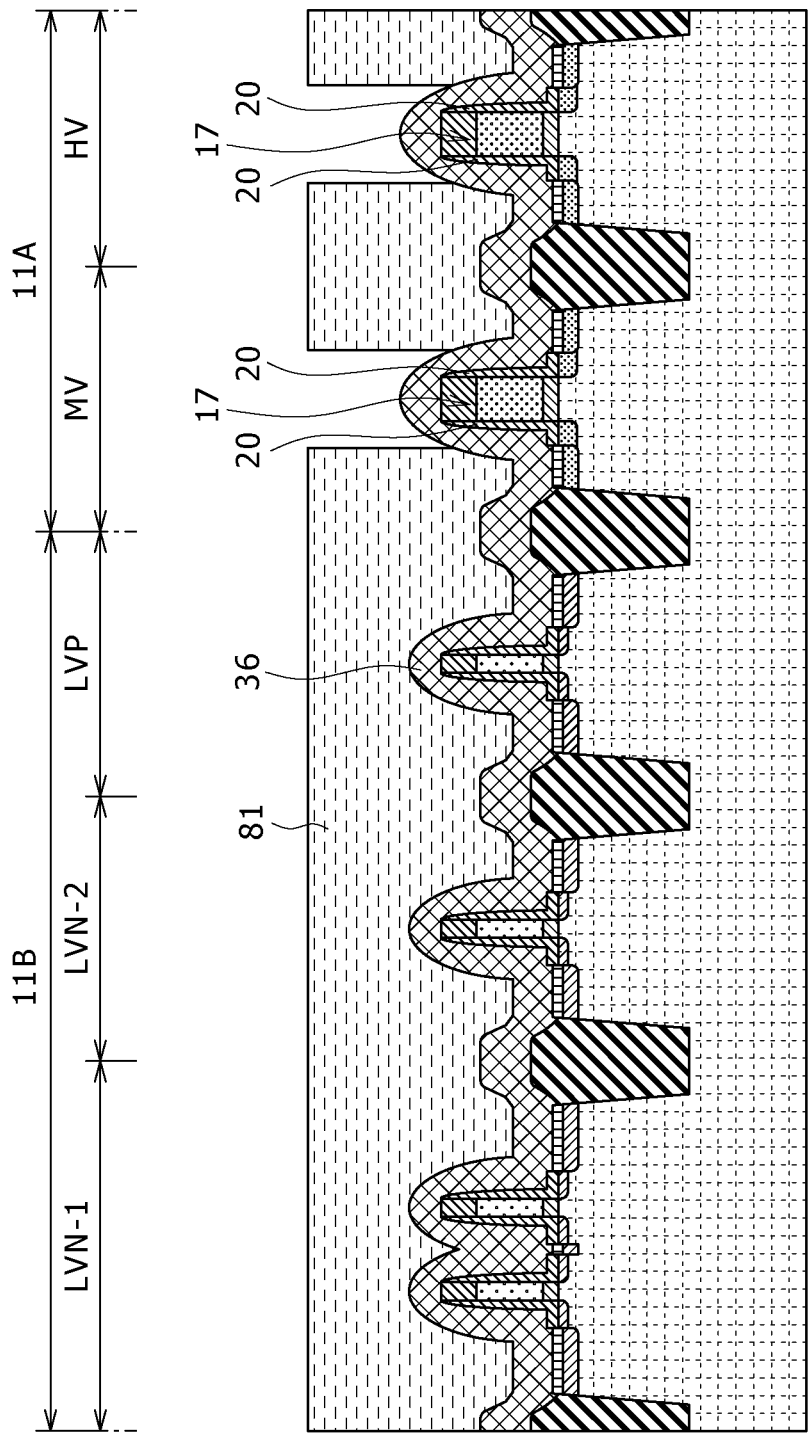

Subsequently, as shown in FIG. 1B, an etching mask 81 is formed on the liner film 36. This etching mask 81 is formed e.g. by forming a resist film across the entire surface by a resist coating technique and then processing the resist film by a lithography technique in such a way that the areas above the gate parts 17 in the first area 11A and the sidewalls 20 formed on the side faces of these gate parts 17 are exposed and the other areas are covered.

Subsequently, as shown in FIG. 1C, a part of the liner film 36, the hard masks 74A (see FIG. 1A), upper parts of the first gate electrodes 15, and upper parts of the sidewalls 20 are etched with use of this etching mask 81. Thereby, upper parts of the first gate electrodes 15 are exposed, and the height of the first gate electrodes 15 is set smaller than that of the dummy gate electrodes 16. For example, the height of the first gate electrodes 15 is set smaller by a value in the range of 20 nm to 30 nm than that of the dummy gate electrodes 16. This etching is performed under the following condition for example: magnetron reactive ion etching (RIE) apparatus is used; the pressure of the etching atmosphere is 5.9 Pa; the output is 500 W; trifluoromethane ($CHF_3$) (the flow rate is 20 $cm^3$/min), oxygen ($O_2$) (the flow rate is 10 $cm^3$/min), and argon (Ar) (the flow rate is 100 $cm^3$/min) are used as the etching gas; and a magnetic field of 120 G (gausses) is generated. Thereafter, the etching mask 81 is removed.

Figure 1D:
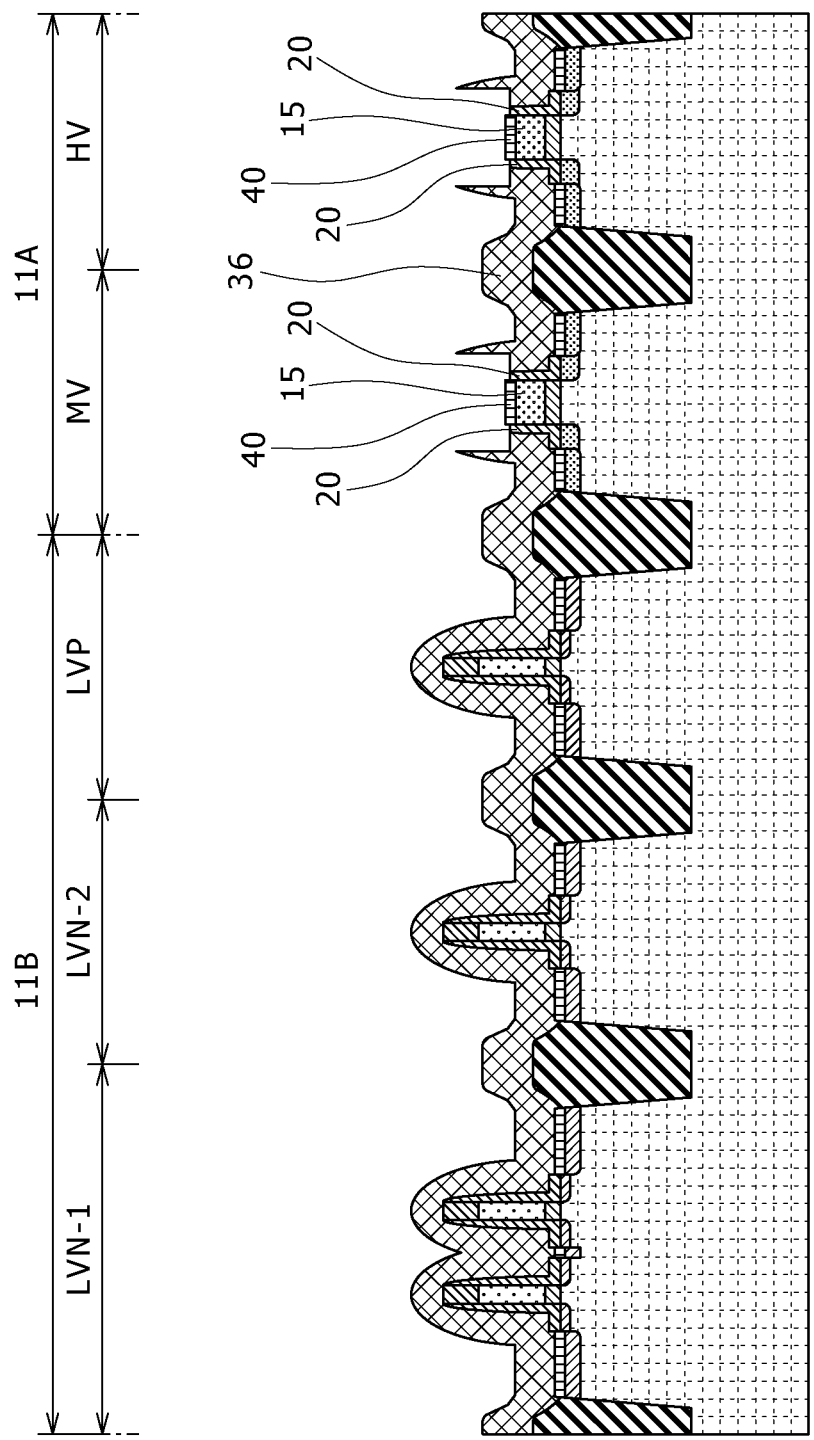

Subsequently, as shown in FIG. 1D, a silicide layer 40 is formed on the respective first gate electrodes 15. Initially, a metal layer for forming silicide is formed over the entire surface. In the present embodiment, cobalt (Co) is used for the metal layer as one example. The metal layer is formed by deposing cobalt to a thickness in the range of e.g. 6 nm to 8 nm by e.g. sputtering. Subsequently, RTA is performed at a temperature in the range of 500° C. to 600° C. to thereby form the silicide layer 40 through the reaction of only the metal layer on silicon (Si) of the first gate electrodes 15. Because the metal layer is composed of cobalt, the silicide layer 40 is obtained as a cobalt silicide (e.g. CoSi) layer. Thereafter, the unreacted cobalt on the insulating films (e.g. the sidewalls 20 and the liner film 36) is removed by wet etching with a mixed liquid of sulfuric acid ($H_2SO_4$) and hydrogen peroxide ($H_2O_2$). Subsequently, heat treatment is performed to form lower-resistance cobalt silicide ($CoSi_2$). This heat treatment is performed by e.g. RTA at a temperature in the range of 650° C. to 850° C. for 30 seconds. It is also possible that nickel (Ni) or nickel-platinum (NiPt) is used for the metal layer instead of cobalt (Co) to thereby form nickel silicide ($NiSi_2$). In any case, the RTA temperature can be adequately set.

Figure 1E:
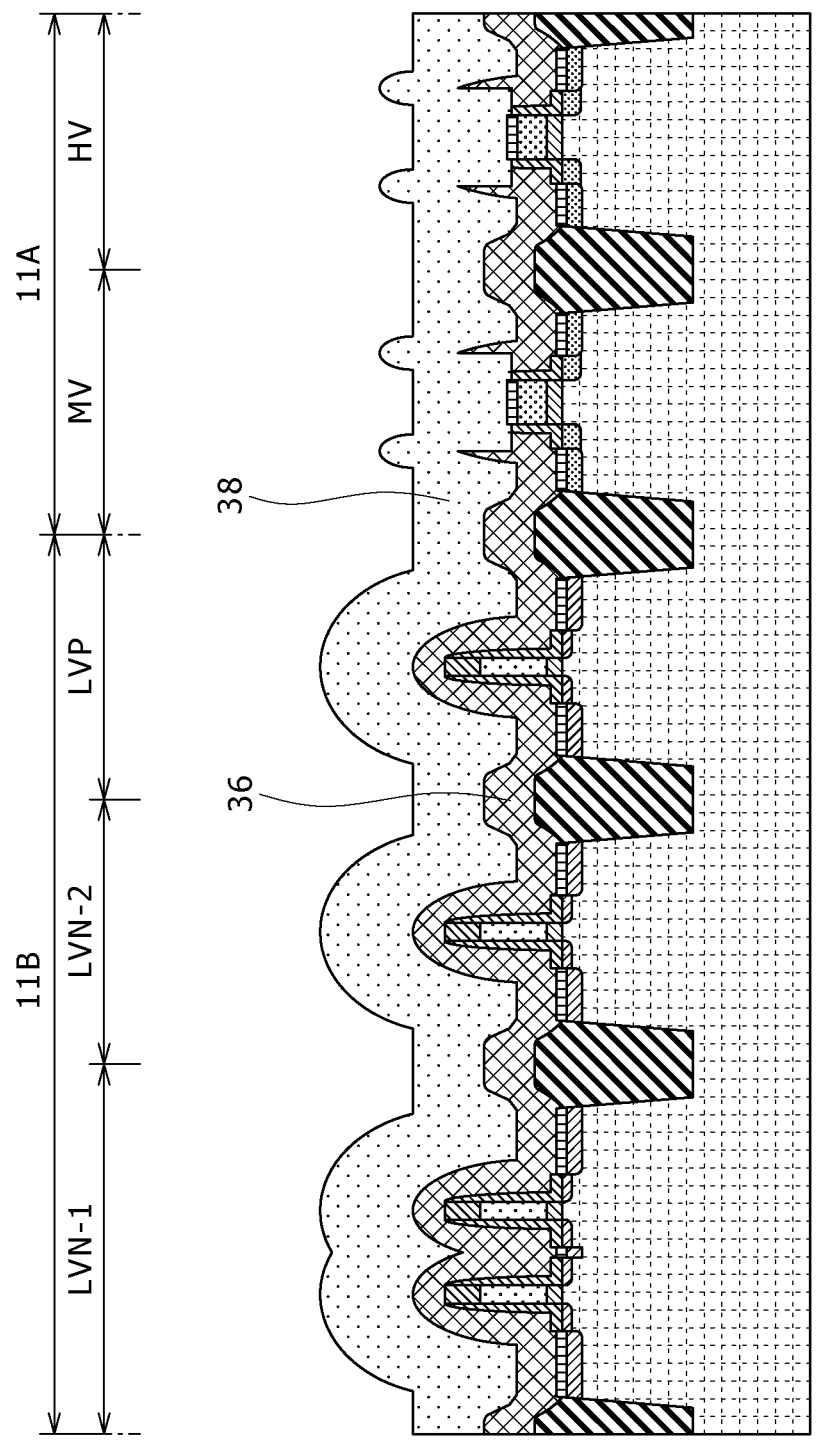

Referring next to FIG. 1E, an interlayer insulating film 38 as a part of the insulating film is formed on the liner film 36.

This interlayer insulating film 38 is formed e.g. by using a silicon oxide ($SiO_2$) film having a thickness in the range of 100 nm to 200 nm by high density plasma (HDP) CVD.

Figure 1F:
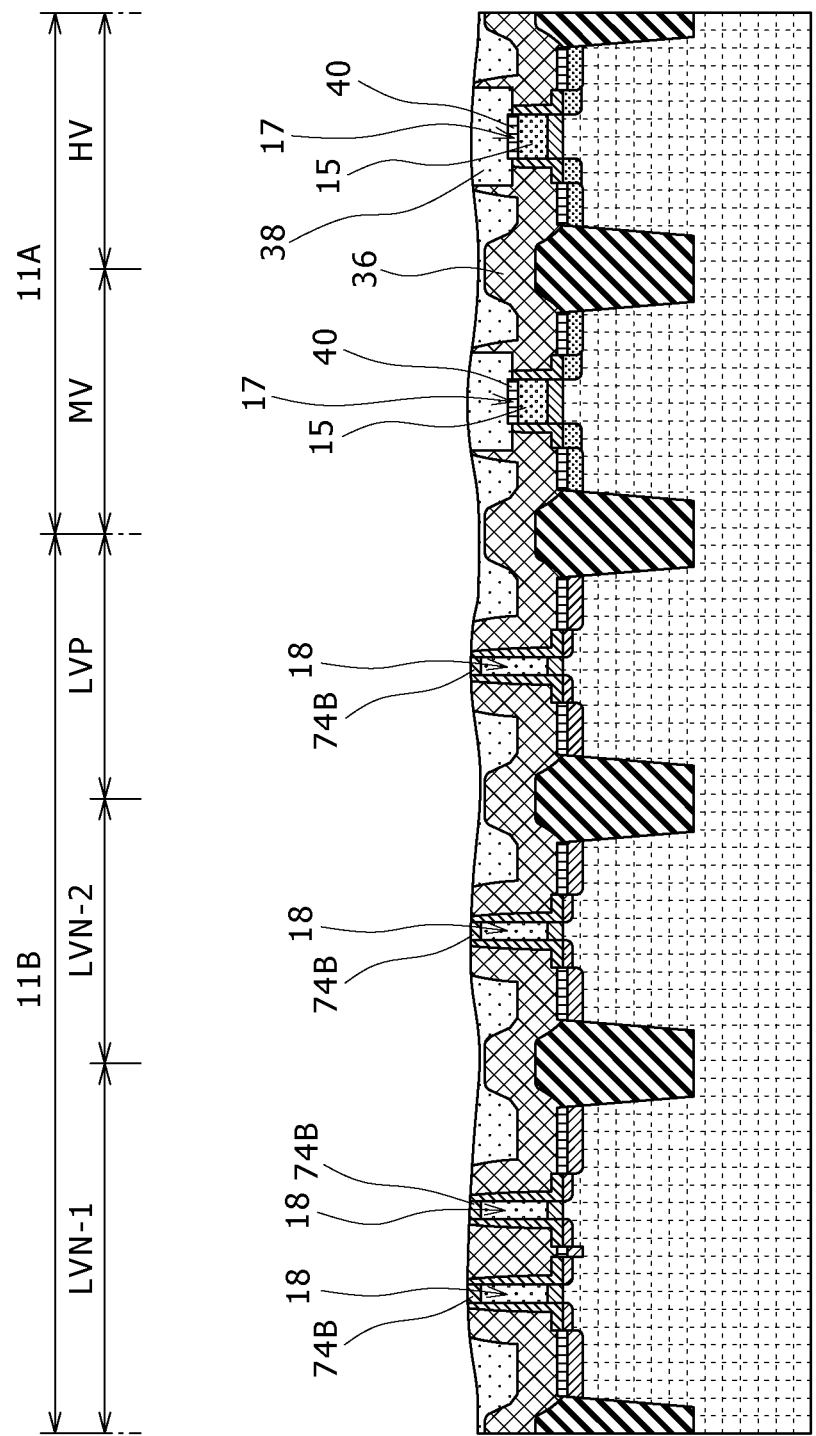

Subsequently, as shown in FIG. 1F, the interlayer insulating film 38 and the liner film 36 over the gate parts 17 and the dummy gate parts 18 are polished by chemical mechanical polishing (CMP), to thereby expose the hard masks 74B. One example of the condition of this CMP is as follows: a polishing pad composed of foamed polyurethane is used; the polishing pressure is 300 hPa; the rotational speed of the platen is 100 rpm; the rotational speed of the polishing head is 107 rpm; a ceria-based slurry is used as the polishing slurry; the slurry flow rate is 200 cm$^3$/min; and the slurry temperature is in the range of 25° C. to 30° C. As for the polishing time, over-polishing for 30 seconds from the timing of just-polishing corresponding to detection of the torque end point is performed. At the end timing of this polishing, the polished surface has not yet been planarized. The above-described polishing with use of a ceria-based slurry has the following characteristic. Specifically, on a flat surface, a silicon oxide film is polished but it is difficult to polish films other than the silicon oxide film, such as a silicon nitride film. On the other hand, on a projection, a silicon oxide film is polished and films other than the silicon oxide film, such as a silicon nitride film, are also polished.

Subsequently, as shown in FIG. 1G, the interlayer insulating film 38, the liner film 36, and the hard masks 74B are further polished by chemical mechanical polishing (CMP), to thereby expose the dummy gate electrodes 16. At this time, the silicide layer 40 formed on the first gate electrodes 15 in the first area 11A is covered by the interlayer insulating film 38. This interlayer insulating film 38 serves as the protective film for the silicide layer 40. One example of the condition of this CMP is as follows: a polishing pad composed of foamed polyurethane is used; the polishing pressure is 300 hPa; the rotational speed of the platen is 100 rpm; the rotational speed of the polishing head is 107 rpm; a ceria-based slurry is used as the polishing slurry; the slurry flow rate is 200 cm$^3$/min; and the slurry temperature is in the range of 25° C. to 30° C. As for the polishing time, over-polishing for 30 seconds from the timing of just-polishing corresponding to detection of the torque end point is performed. Therefore, this CMP can be performed continuously with the CMP described with FIG. 1F. As a result, the polished surface is substantially planarized.

Subsequently, as shown in FIG. 1H, the dummy gate electrodes 16 and the dummy gate insulating film 14 (see FIG. 1A) in the second area 11B are removed by etching with use of the liner film 36 and the interlayer insulating film 38 as the etching mask. For example, the dummy gate electrodes 16 are removed by dry etching, and then the dummy gate insulating film 14 is removed by wet etching with a diluted hydrofluoric acid. As a result, gate forming trenches 42 are formed in the second area 11B.

Subsequently, a second gate insulating film 43 is formed on the inside surfaces of the gate forming trenches 42. This second gate insulating film 43 is so formed that the capacitance of the second gate insulating film 43 per unit area is lower than that of the first gate insulating film 13 in the first area 11A per unit area. The second gate insulating film 43 is formed by using a high dielectric constant film by atomic layer deposition (ALD). The high dielectric constant film is formed by using e.g. oxide, silicate, silicate nitride, or oxynitride of hafnium, zirconium, lanthanum, yttrium, tantalum, or aluminum. Specifically, it is formed by using e.g. hafnium oxide ($HfO_2$), zirconium oxide ($ZrO_2$), lanthanum oxide ($LaO_3$), yttrium oxide ($Y_2O_3$), tantalum oxide ($Ta_2O_5$), aluminum oxide ($Al_2O_3$), hafnium silicate ($HfSiO_X$), zirconium silicate ($ZrSiO_X$), lanthanum silicate ($LaSiO_X$), yttrium silicate ($YSiO_X$), tantalum silicate ($TaSiO_X$), aluminum silicate ($AlSiO_X$), zirconium titanate ($ZrTiO_X$), hafnium aluminum oxide ($HfAlO_X$), or hafnium zirconium oxide ($HfZrO_X$), or nitride of any of these compounds. In general, the relative dielectric constant of $HfO_2$ is in the range of 25 to 30 and that of $ZrO_2$ is in the range of 20 to 25, although the relative dielectric constant of the high dielectric constant film changes depending on the composition, the state (crystalline state or amorphous state), and so on.

Subsequently, as shown in FIGS. 1I to 1L, work function control films 44 and 45 that determine work functions are formed over the inside surfaces of the gate forming trenches 42 with the intermediary of the second gate insulating film 43.

Initially, a metal or metal compound having a work function appropriate for the NMISFETs is deposited by a film deposition method such as atomic layer deposition (ALD) or chemical vapor deposition. In general, the gate electrode of an NMISFET has a work function of 4.6 eV or lower, and preferably 4.3 eV or lower. The gate electrode of a PMISFET has a work function of 4.6 eV or higher, and preferably 4.9 eV or higher. It is desirable that the difference in the work function therebetween is equal to or larger than 0.3 eV. Specifically, the work function of $HfSi_X$ for the NMISFETs is in the range of 4.1 to 4.3 eV and that of titanium nitride (TiN) for the PMISFET is in the range of 4.5 to 5.0 eV, although changing depending on the composition, the state (crystalline state or amorphous state), and so on.

Examples of the materials of the work function control films 44 and 45 include metals such as titanium (Ti), vanadium (V), nickel (Ni), zirconium (Zn), niobium (Nb), molybdenum (Mo), ruthenium (Ru), hafnium (Hf), tantalum (Ta), tungsten (W), and platinum (Pt), alloys containing any of these metals, and compounds of these metals. Examples of the metal compounds include metal nitrides and compounds of metal and semiconductor. One example of the compounds of metal and semiconductor is metal silicide.

Examples of the material of the work function control film 44 appropriate for the NMISFETs include metals such as hafnium (Hf) and tantalum (Ta), alloys containing any of these metals, and compounds of these metals. Specifically, hafnium silicide ($HfSi_X$) is preferable. Examples of the material of the work function control film 45 appropriate for the PMISFET include metals such as titanium (Ti), molybdenum (Mo), and ruthenium (Ru), alloys containing any of these metals, and compounds of these metals. Specifically, titanium nitride (TiN) and ruthenium (Ru) are preferable.

Figure 1I:
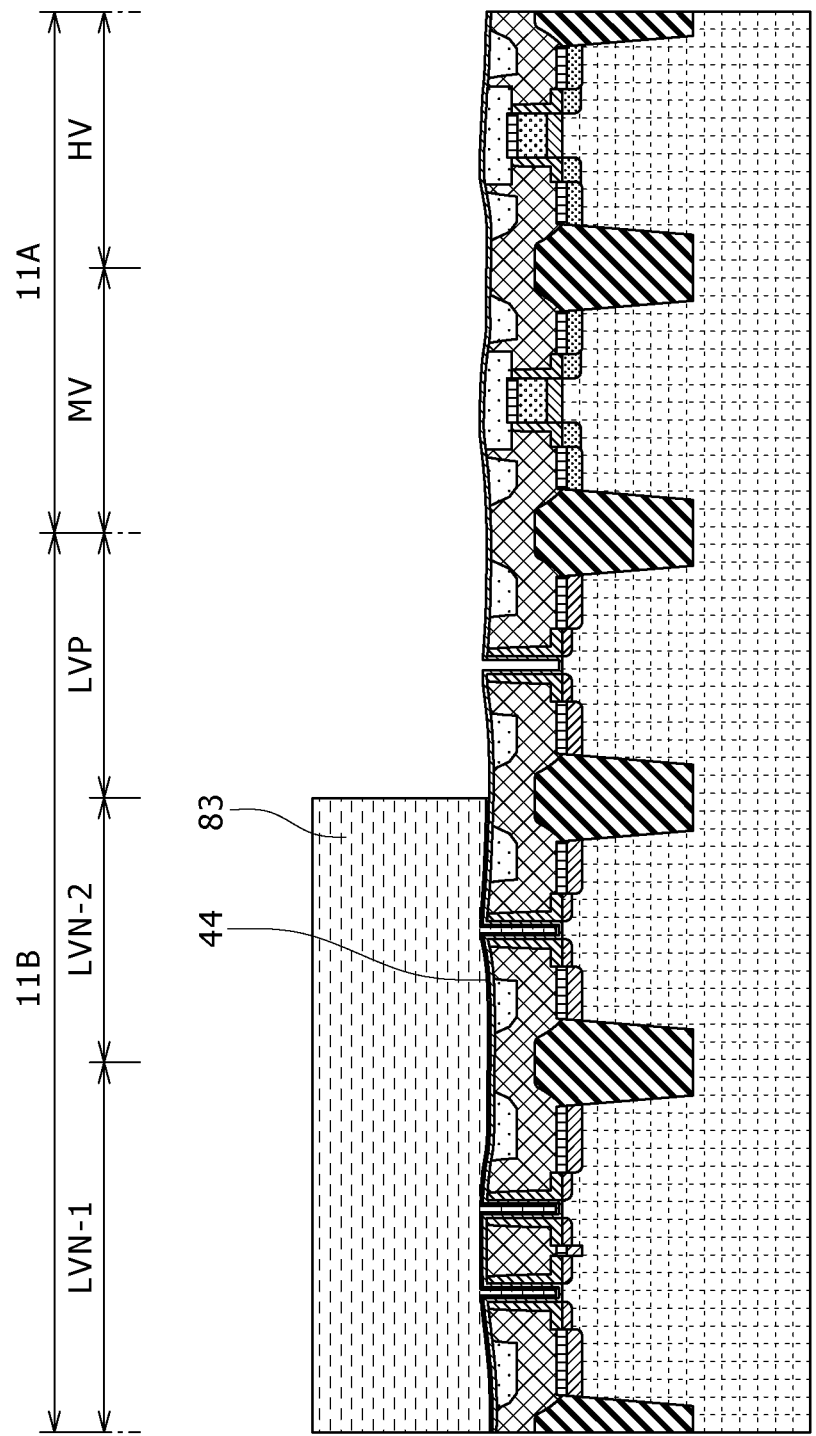

In the present embodiment, as shown in FIG. 1I, the work function control film 44 is formed by depositing e.g. hafnium silicide ($HfSi_X$) to a thickness in the range of e.g. 10 nm to 100 nm. Subsequently, a resist mask 83 that covers the areas LVN-1 and LVN-2 of the second area 11B is formed by resist coating and a lithography technique. The work function control film 44 in the area LVP and the first area 11A is removed by using this resist mask 83 as the etching mask. As a result, the work function control film 44 is left in the areas LVN-1 and LVN-2 of the second area 11B. Thereafter, the resist mask 83 is removed.

Figure 1J:
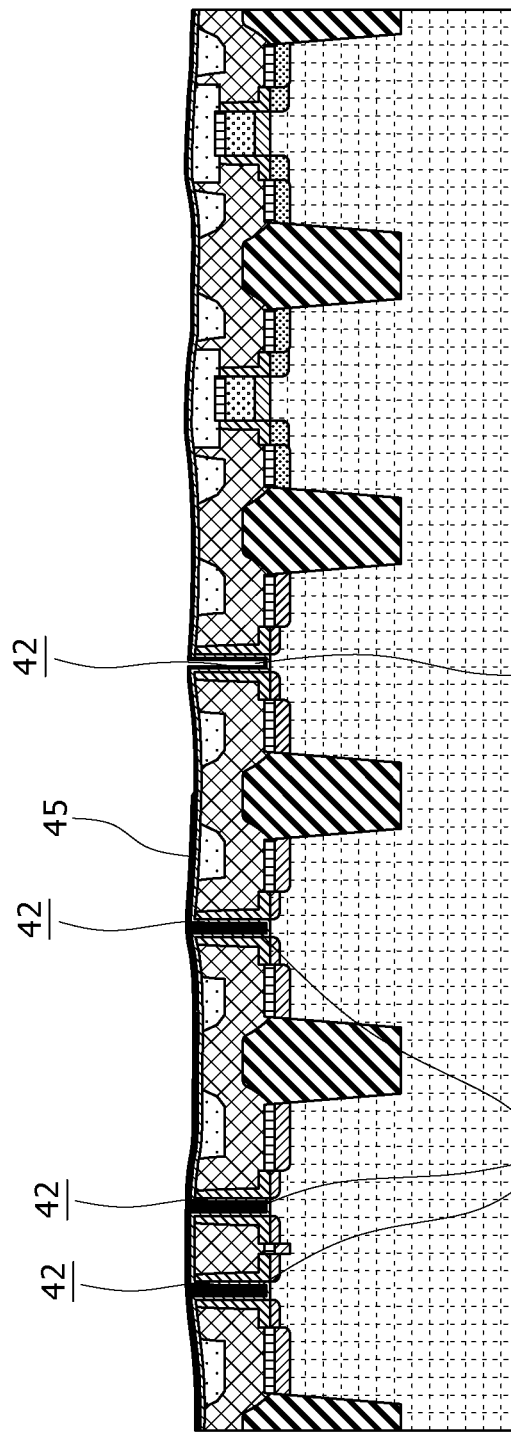

Subsequently, as shown in FIG. 1J, a metal or metal compound having a work function appropriate for the PMISFET is deposited by a film deposition method such as atomic layer deposition (ALD) or chemical vapor deposition in the gate forming trenches 42 in the areas LVN-1 and LVN-2 with the intermediary of the second gate insulating film 43 and the work function control film 44, and in the gate forming trench 42 in the area LVP with the intermediary of the second gate insulating film 43. In the present embodiment, the work function control film 45 is formed by depositing e.g. titanium nitride (TiN) to a thickness in the range of about 5 nm to 50 nm.

Figure 1K:
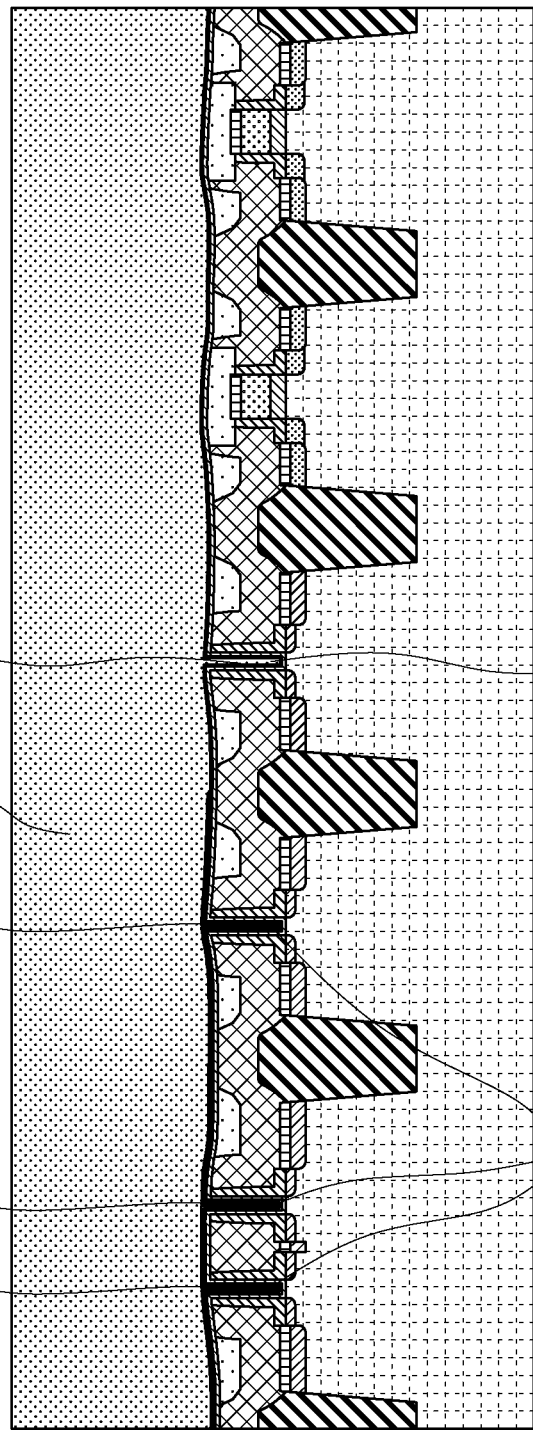

Subsequently, as shown in FIG. 1K, a conductive film 46 composed of an electrically-conductive material is formed to fill the insides of the gate forming trenches 42 with the intermediary of the work function control films 44 and 45 (only the work function control film 45, in the case of the gate forming trench 42 in the area LVP). This conductive film 46 is formed by using e.g. a metal material whose electric resistance is lower than those of the work function control films 44 and 45. In the present embodiment, tungsten (W) is used as one example. This tungsten film is formed through deposition by e.g. CVD. The conductive film 46 has a thickness that allows the gate forming trenches 42 to be completely filled. For example, the thickness is in the range of 200 nm to 400 nm.

It is preferable for the work function control film 45 to be formed only in the gate forming trench 42 in the area LVP. In this case, as shown in FIG. 1L, after the formation of the work function control film 45, a resist mask (not shown) that covers the area LVP of the second area 11B is formed by resist coating and a lithography technique. The work function control film 45 in the areas LVN-1 and LVN-2 of the second area 11B and the first area 11A is removed by using this resist mask as the etching mask. As a result, the work function control film 45 is left in the area LVP of the second area 11B. It is also possible to deposit e.g. ruthenium (Ru) for the PMISFET. Thereafter, the resist mask is removed. Subsequently, the conductive film 46 composed of an electrically-conductive material is formed to fill the insides of the gate forming trenches 42, with the intermediary of the work function control film 44 in the gate forming trenches 42 in the areas LVN-1 and LVN-2, and with the intermediary of the work function control film 45 in the gate forming trench 42 in the area LVP. In this case, it does not matter which of the work function control films 44 and 45 is formed first.

Figure 1M:
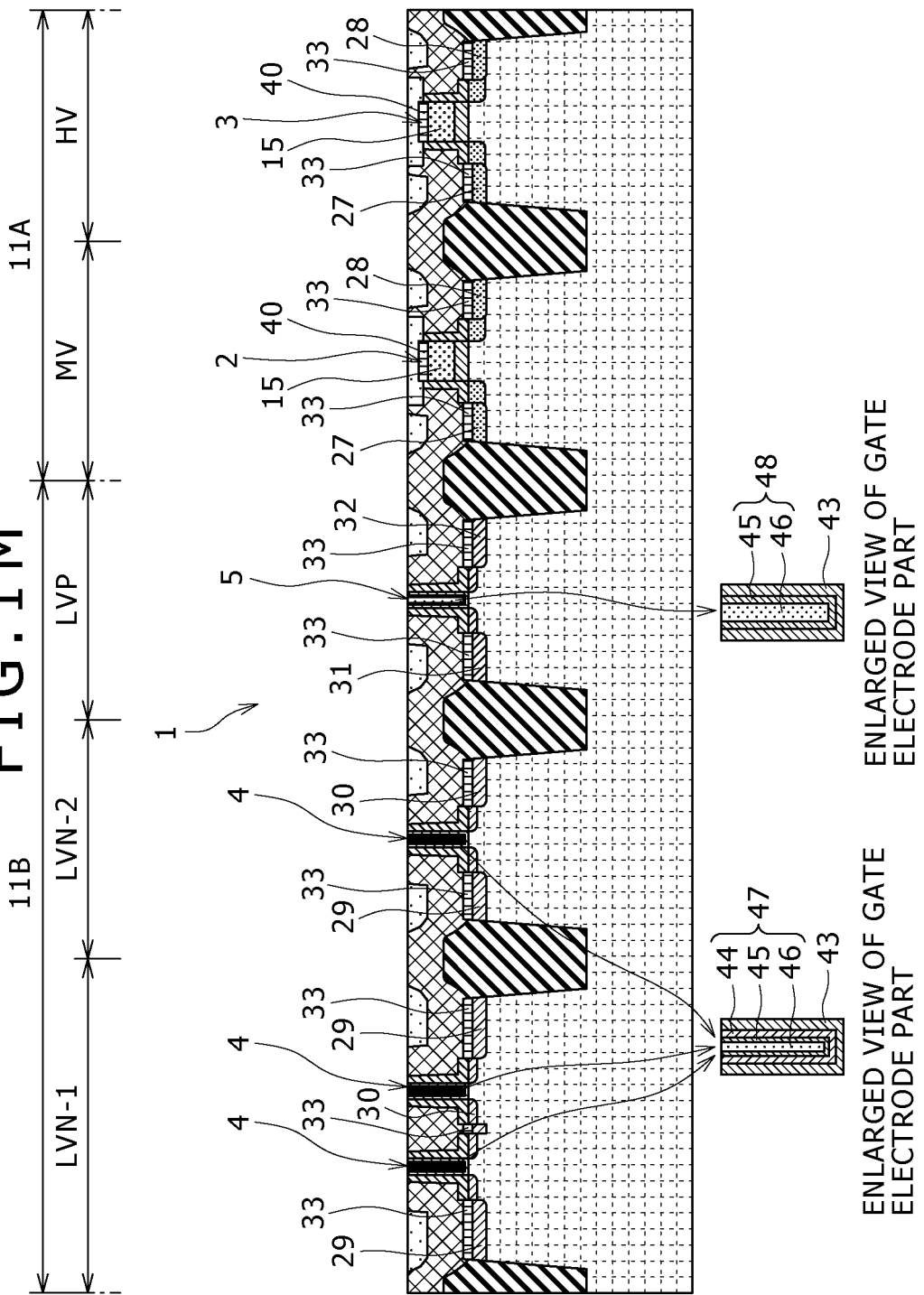

Subsequently, as shown in FIG. 1M, the excess conductive film 46 (see FIGS. 1K and 1L) outside the gate forming trenches 42 is removed. For this removal processing, e.g. chemical mechanical polishing (CMP) is used. In this CMP, the liner film 36, the interlayer insulating film 38, and so on serve as the polishing stopper. As a result of the CMP step, second gate electrodes 47 of the low-voltage transistors (NMISFETs) in the second area 11B are formed by the conductive film 46 and the work function control film 44 left in the gate forming trenches 42. Furthermore, a second gate electrode 48 of the low-voltage transistor (PMISFET) is formed by the conductive film 46 and the work function control film 45 left in the gate forming trench 42.

Thereafter, as one example, although not shown in the drawing, another interlayer insulating film is formed across the entire surface on the liner film 36 and the interlayer insulating film 38. Subsequently, connection holes that reach the silicide layer 40 on the first gate electrodes 15 of the respective transistors, the second gate electrodes 47 and 48, and the silicide layer 33 on the source/drain regions 27 to 32 are formed, followed by a wiring step and so forth.

In this manner, as the first transistor group, a middle-voltage transistor (NMISFET) 2 is formed in the area MV of the first area 11A, and a high-voltage transistor (NMISFET) 3 is formed in the area HV. In addition, as the second transistor group, low-voltage transistors (NMISFETs) 4 are formed with high density in the area LVN-1 of the second area 11B, and the low-voltage transistor (NMISFET) 4 is formed in the area LVN-2 in an isolated manner. Furthermore, a low-voltage transistor (PMISFET) 5 is formed in the area LVP. The semiconductor device 1 is formed by these transistors.

By the method for manufacturing the semiconductor device 1 (first embodiment), as the first transistor group on the semiconductor substrate 11, the middle-voltage transistor (NMISFET) 2 is formed in the area MV and the high-voltage transistor (NMISFET) 3 is formed in the area HV. In addition, as the second transistor group whose operating voltage is lower than that of the first transistor group, the low-voltage transistors (NMISFETs) 4 are formed with high density in the area LVN-1 of the second area 11B, and the low-voltage transistor (NMISFET) 4 is formed in the area LVN-2 in an isolated manner. Moreover, after the formation of the silicide layer 40 on the first gate electrodes 15 of the first transistor group, the interlayer insulating film 38 is formed to protect the silicide layer 40, followed by the formation of the second gate electrodes 47 and 48 of the second transistor group. Therefore, in the formation of the second gate electrodes 47 and 48, even when polishing for removing the excess part of the metal material of the second gate electrodes 47 and 48 is performed for example, cutting and eliminating of the silicide layer 40 on the first gate electrodes 15 is avoided due to the interlayer insulating film 38, so that the silicide layer 40 of the first transistor group is protected. Thus, due to the silicide layer 40, the electric resistance of the first gate electrodes 15 is decreased.

In addition, after the interlayer insulating film 38 is formed, the surfaces of the interlayer insulating film 38 and the liner film 36 are planarized. This avoids a problem that a residue of the conductive film is left on the interlayer insulating film 38, the liner film 36, and so on as a result of the polishing of the conductive film. Thus, when electrodes and interconnects connected to the respective transistors are formed later, short-circuiting attributed to the residue and other causes of defects will not occur.

Consequently, the manufacturing method of the first embodiment provides an advantage of forming on the same semiconductor substrate 11 the first transistor group (high-breakdown-voltage (high-voltage-operating, middle-voltage-operating) transistor group) that has the gate insulating film 13 composed of silicon oxide or silicon oxynitride and the first gate electrodes 15 composed of polysilicon or amorphous silicon and the second transistor group (e.g. low-voltage-operating transistor group) that has the gate insulating film 43 formed of a high dielectric constant (High-k) film and the second gate electrodes 47 and 48 as so-called metal gate electrodes, and an advantage of allowing decrease in the resistance of the first gate electrodes 15 of the first transistor group.

Next, a method for manufacturing a semiconductor device according to one embodiment (second embodiment) of the present invention will be described below with reference to the manufacturing-step sectional views of FIGS. 2A to 2C.

Figure 2A:
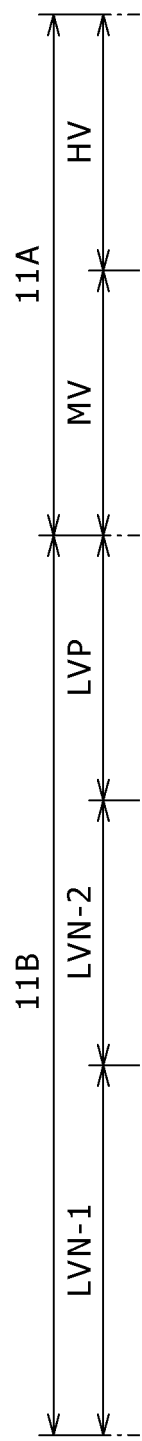
Figure 2A:
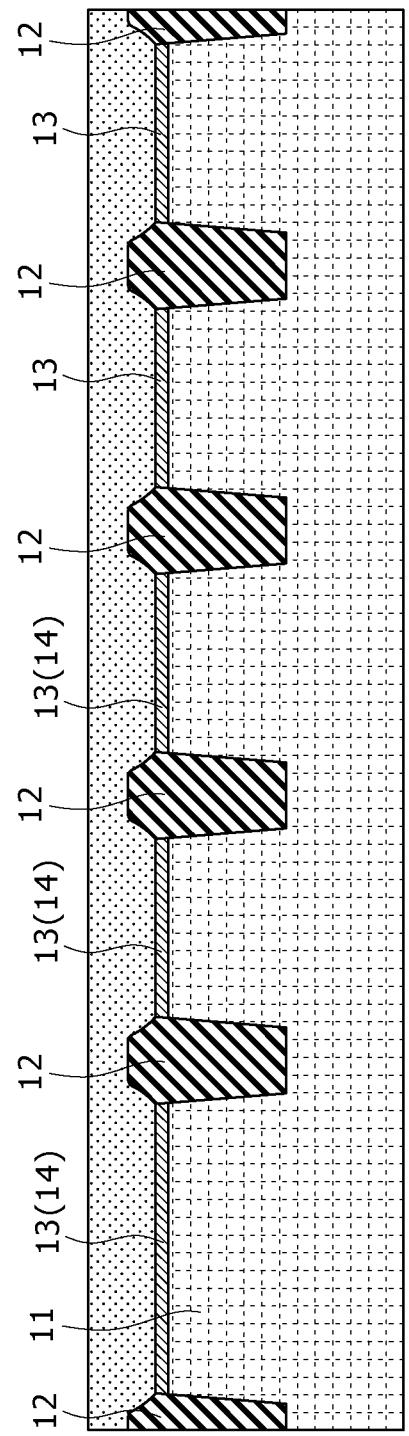

As shown in FIG. 2A, a silicon semiconductor substrate is used as a semiconductor substrate 11. An element isolation step is carried out for the semiconductor substrate 11 to thereby form element isolation regions 12 that isolate areas LVN-1, LVN-2, LVP, MV, and HV from each other. In the areas LVN-1, LVN-2, and LVP, low-voltage transistors (e.g. MISFETs) are to be formed. In the area MV, a middle-voltage transistor (e.g. MISFET) is to be formed. In the area HV, a high-voltage transistor (e.g. MISFET) is to be formed. The areas MV and HV include both an area in which the MISFET pattern density will be high and an area that will have an isolated MISFET pattern. The area HV, in which the high-voltage transistor is to be formed, and the area MV, in which the middle-voltage transistor is to be formed, are defined as a first area 11A. The area LVN-1, in which NMISFETs as the low-voltage transistors are to be formed with high density, the area LVN-2, in which an NMISFET as the low-voltage transistor is to be formed in an isolated manner, and the area LVP, in which a PMISFET as the low-voltage transistor is to be formed, are defined as a second area 11B.

Subsequently, ion implantation for forming P-well regions (not shown) in the areas in which the NMISFETs are to be formed, ion implantation for forming buried layers (not shown) for preventing punch-through of the MISFETs, and ion implantation for adjusting the threshold voltage (Vth) are adequately performed, to thereby form NMIS channel regions. In addition, ion implantation for forming N-well regions (not shown) in the areas in which the PMISFETs are to be formed, ion implantation for forming buried layers (not shown) for preventing punch-through of the MISFETs, and ion implantation for adjusting the threshold voltage (Vth) are adequately performed, to thereby form PMIS channel regions. The ion implantation may be performed with different ion implantation conditions that each correspond to a respective one of the area HV, in which the high-voltage transistor is to be formed, the area MV, in which the middle-voltage transistor is to be formed, and the areas LVN-1, LVN-2, and LVP, in which the respective low-voltage transistors are to be formed.

Subsequently, a gate insulating film 13 is formed on the surfaces of the area HV and the area MV of the semiconductor substrate 11. The high-voltage transistor and the middle-voltage transistor frequently have a thick gate insulating film, and the gate insulating film 13 is formed by using e.g. a silicon oxide film. This silicon oxide film is formed by e.g. thermal oxidation at a temperature in the range of 750° C. to 900° C., and the thickness thereof is in the range of 2 nm to 4 nm. In the formation of the gate insulating film 13, the gate insulating film 13 is formed also above the active regions in the second area 11B simultaneously. This gate insulating film 13 in the second area 11B is used as a dummy gate insulating film 14.

Subsequently, an electrode forming film 71 for forming first gate electrodes and dummy gate electrodes is formed on the gate insulating film 13 and the dummy gate insulating film 14. This electrode forming film 71 is formed by depositing e.g. polysilicon or amorphous silicon over the entire surface with the intermediary of the gate insulating film 13 and the dummy gate insulating film 14 on the semiconductor substrate 11. For example, if the electrode forming film 71 is formed by using polysilicon, low-pressure CVD in which e.g. monosilane ($SiH_4$) is the source gas and the deposition temperature is in the range of 580° C. to 620° C. is used to deposit polysilicon to a thickness in the range of 100 nm to 150 nm. Subsequently, an ion implantation step for reducing the gate resistance is carried out for the partial portion of the electrode forming film 71 in the first area 11A.

Subsequently, as shown in FIG. 2B, a resist mask 72 that covers the areas LVN-1, LVN-2, and LVP of the second area 11B is formed by resist coating and a lithography technique. By using this resist mask 72 as an ion implantation mask, ion implantation into the electrode forming film 71 in the areas MV and HV is performed. In this ion implantation, e.g. phosphorous (P) is used as the impurity, and the implantation energy and the dose amount are set to 5 keV and $8 \times 10^{15}/cm^2$, respectively.

Figure 2C:
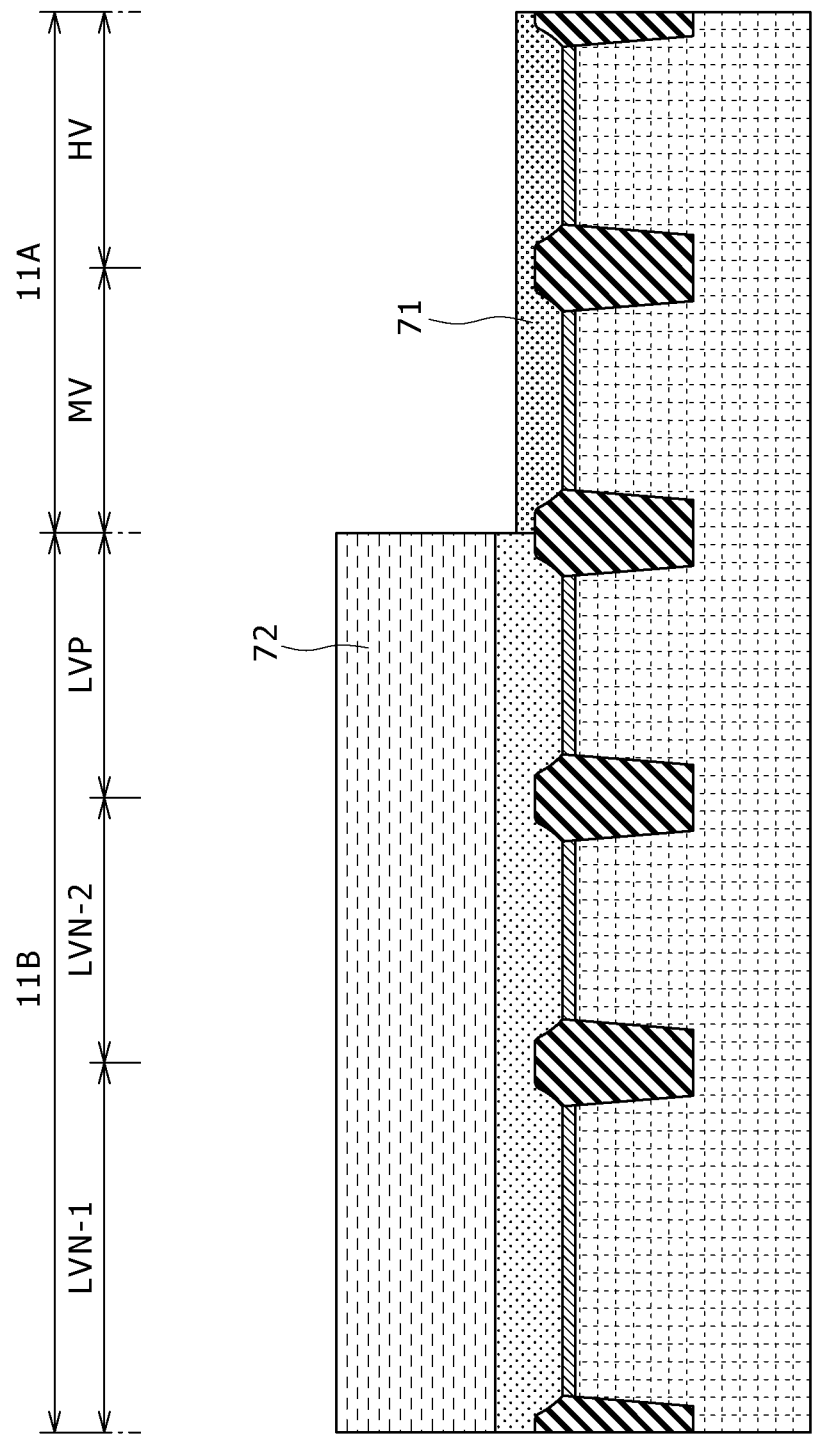

Subsequently, as shown in FIG. 2C, an upper part of the electrode forming film 71 in the first area 11A is removed by etching (wet etching or dry etching) with use of the resist mask 72 as the etching mask. As a result, the height of the electrode forming film 71 in the first area 11A is set smaller than that of the electrode forming film 71 in the second area 11B. For example, the height of the electrode forming film 71 in the first area 11A is set smaller by a value in the range of 20 nm to 30 nm than that of the electrode forming film 71 in the second area 11B. Subsequently, the resist mask 72 is removed. Thereafter, similarly to the above description of the first embodiment, the step of forming a hard mask layer and the subsequent steps are carried out. However, the step of removing upper parts of the first gate electrodes 15 in the first area, described with FIGS. 1B and 1C for the first embodiment, is not carried out. That is, the interlayer insulating film 38 is formed immediately after the liner insulating film 36 is formed.

The second embodiment provides the same advantageous effects as those by the first embodiment.

Next, a method for manufacturing a semiconductor device according to one embodiment (third embodiment) of the present invention will be described below.

The steps of the third embodiment are the same as those of the second embodiment, except that the method for setting the height of the electrode forming film 71 in the first area 11A smaller than that of the electrode forming film 71 in the second area 11B is different.

Specifically, in the manufacturing method of the third embodiment, although not shown in a drawing, an epitaxial growth mask formed of e.g. a silicon nitride film is formed in the first area 11A after the electrode forming film 71 is formed. Subsequently, selective epitaxial growth of silicon on the surface of the electrode forming film 71 in the second area 11B is performed to thereby increase the thickness of the electrode forming film 71 in the second area 11B. As a result, the height of the electrode forming film 71 in the first area 11A is set smaller than that of the electrode forming film 71 in the second area 11B.

The third embodiment provides the same advantageous effects as those by the second embodiment.

Next, a method for manufacturing a semiconductor device according to one embodiment (fourth embodiment) of the present invention will be described below with reference to the manufacturing-step sectional views of FIGS. 3A and 3B.

Figure 3A:
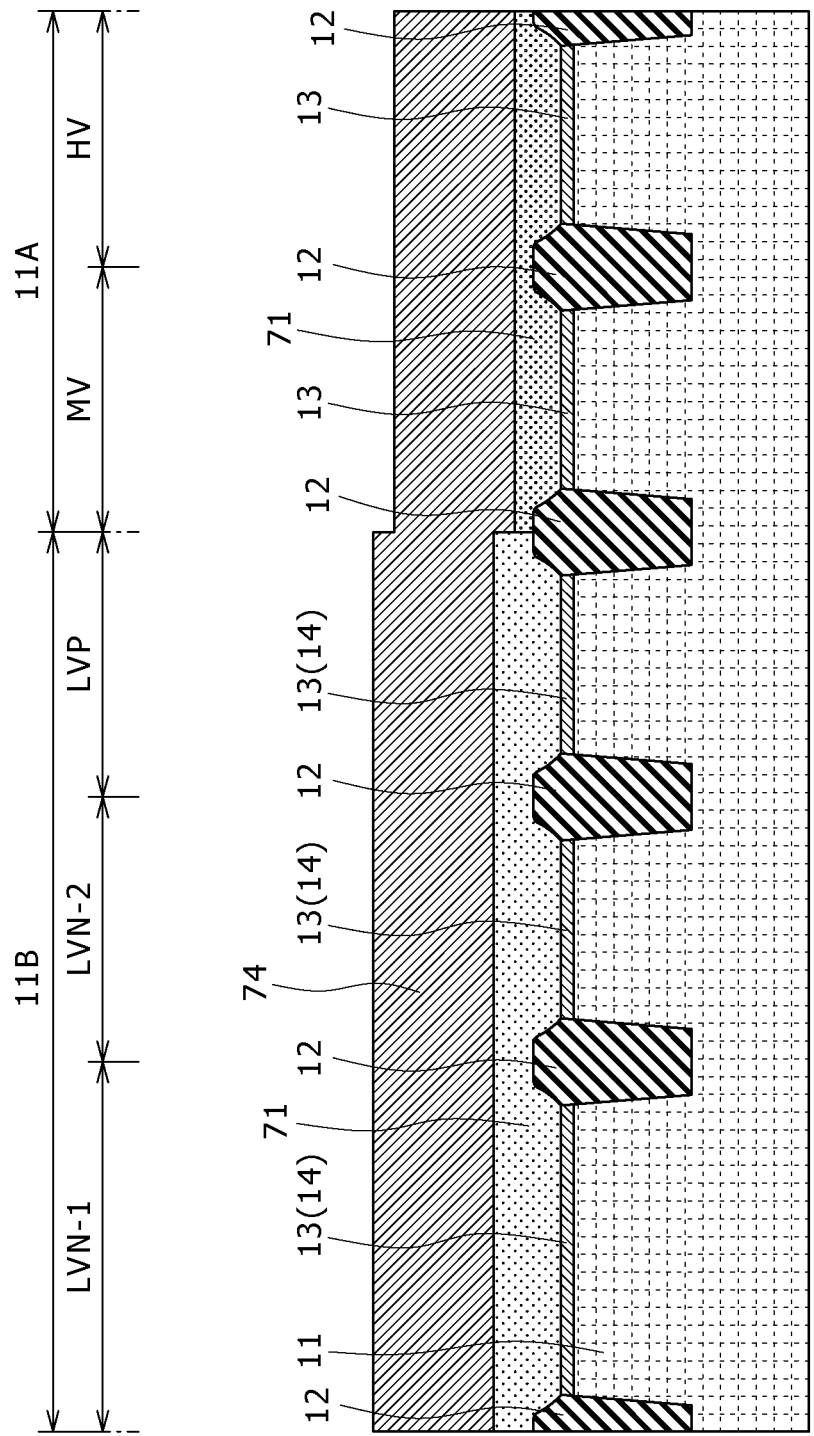
FIGS. 3A and 3B are manufacturing-step sectional views showing a method for manufacturing a semiconductor device according to one embodiment (fourth embodiment) of the present invention.

As shown in FIG. 3A, a silicon semiconductor substrate is used as a semiconductor substrate 11 similarly to the above description of the third embodiment. An element isolation step is carried out for the semiconductor substrate 11 to thereby form element isolation regions 12 that isolate areas LVN-1, LVN-2, LVP, MV, and HV from each other. In the areas LVN-1, LVN-2, and LVP, low-voltage transistors (e.g. MISFETs) are to be formed. In the area MV, a middle-voltage transistor (e.g. MISFET) is to be formed. In the area HV, a high-voltage transistor (e.g. MISFET) is to be formed. The areas MV and HV include both an area in which the MISFET pattern density will be high and an area that will have an isolated MISFET pattern. The area HV, in which the high-voltage transistor is to be formed, and the area MV, in which the middle-voltage transistor is to be formed, are defined as a first area 11A. The area LVN-1, in which NMISFETs as the low-voltage transistors are to be formed with high density, the area LVN-2, in which an NMISFET as the low-voltage transistor is to be formed in an isolated manner, and the area LVP, in which a PMISFET as the low-voltage transistor is to be formed, are defined as a second area 11B.

Subsequently, ion implantation for forming P-well regions (not shown) in the areas in which the NMISFETs are to be formed, ion implantation for forming buried layers (not shown) for preventing punch-through of the MISFETs, and ion implantation for adjusting the threshold voltage (Vth) are adequately performed, to thereby form NMIS channel regions. In addition, ion implantation for forming N-well regions (not shown) in the areas in which the PMISFETs are to be formed, ion implantation for forming buried layers (not shown) for preventing punch-through of the MISFETs, and ion implantation for adjusting the threshold voltage (Vth) are adequately performed, to thereby form PMIS channel regions. The ion implantation may be performed with different ion implantation conditions that each correspond to a respective one of the area HV, in which the high-voltage transistor is to be formed, the area MV, in which the middle-voltage transistor is to be formed, and the areas LVN-1, LVN-2, and LVP, in which the respective low-voltage transistors are to be formed.

Subsequently, a gate insulating film 13 is formed on the surfaces of the area HV and the area MV of the semiconductor substrate 11. The high-voltage transistor and the middle-voltage transistor frequently have a thick gate insulating film, and the gate insulating film 13 is formed by using e.g. a silicon oxide film. This silicon oxide film is formed by e.g. thermal oxidation at a temperature in the range of 750° C. to 900° C., and the thickness thereof is in the range of 2 nm to 4 nm. In the formation of the gate insulating film 13, the gate insulating film 13 is formed also above the active regions in the second area 11B simultaneously. This gate insulating film 13 in the second area 11B is used as a dummy gate insulating film 14.

Subsequently, an electrode forming film 71 for forming first gate electrodes and dummy gate electrodes is formed on the gate insulating film 13 and the dummy gate insulating film 14. This electrode forming film 71 is formed by depositing e.g. polysilicon or amorphous silicon over the entire surface with the intermediary of the gate insulating film 13 and the dummy gate insulating film 14 on the semiconductor substrate 11. For example, if the electrode forming film 71 is formed by using polysilicon, low-pressure CVD in which e.g. monosilane ($SiH_4$) is the source gas and the deposition temperature is in the range of 580° C. to 620° C. is used to deposit polysilicon to a thickness in the range of 100 nm to 150 nm. Subsequently, an ion implantation step for reducing the gate resistance is carried out for the partial portion of the electrode forming film 71 in the first area 11A.

Subsequently, a resist mask (not shown) that covers the areas LVN-1, LVN-2, and LVP of the second area 11B is formed by resist coating and a lithography technique. By using this resist mask as an ion implantation mask, ion implantation into the electrode forming film 71 in the areas MV and HV is performed. In this ion implantation, e.g. phosphorous (P) is used as the impurity, and the implantation energy and the dose amount are set to 5 keV and $8 \times 10^{15}/cm^2$, respectively.

Subsequently, an upper part of the electrode forming film 71 in the first area 11A is removed by etching (wet etching or dry etching) with use of the resist mask as the etching mask. If dry etching is used for this etching, as one example, initially etching for removing a natural oxide film on the polysilicon surface is performed for 10 seconds under the following condition: tetrafluoromethane ($CF_4$) (the flow rate is 100 $cm^3$/min) is used as the etching gas; the pressure of the etching atmosphere is 1.3 Pa; the high frequency power between the electrodes is 300 W; and the reflected flux is 80 Wb. Subsequently, etching for polysilicon is performed under the following condition: hydrogen bromide (HBr) (the flow rate is 200 $cm^3$/min) and oxygen ($O_2$) (the flow rate is 3 $cm^3$/min) are used as the etching gas; the pressure of the etching atmosphere is 1.3 Pa; the high frequency power between the electrodes is 300 W; and the reflected flux is 80 Wb. Alternatively, if wet etching is used for the etching, the following condition is employed: a solution of ammonia hydrogen peroxide mixture ($NH_4OH+H_2O_2+H_2O$) is used as the etchant; the etchant temperature is 70° C.; and the etching rate is 20 nm/10 min. As a result of the etching, the height of the electrode forming film 71 in the first area 11A is set smaller than that of the electrode forming film 71 in the second area 11B. Thereafter, the resist mask is removed. Subsequently, a hard mask layer 74 is formed similarly to the above description of the first embodiment. This hard mask layer 74 is formed by depositing silicon nitride (SiN) to a thickness in the range of e.g. 50 nm to 100 nm by e.g. low-pressure CVD (LP-CVD). At this time, a step is formed on the surface of the hard mask layer 74 due to the influence of the step of the underlying electrode forming film 71. If a step is thus formed on the surface of the hard mask layer 74, it is difficult to carry out the subsequent lithography step and etching step for forming gate parts and dummy gate parts with high accuracy.

Figure 3B:
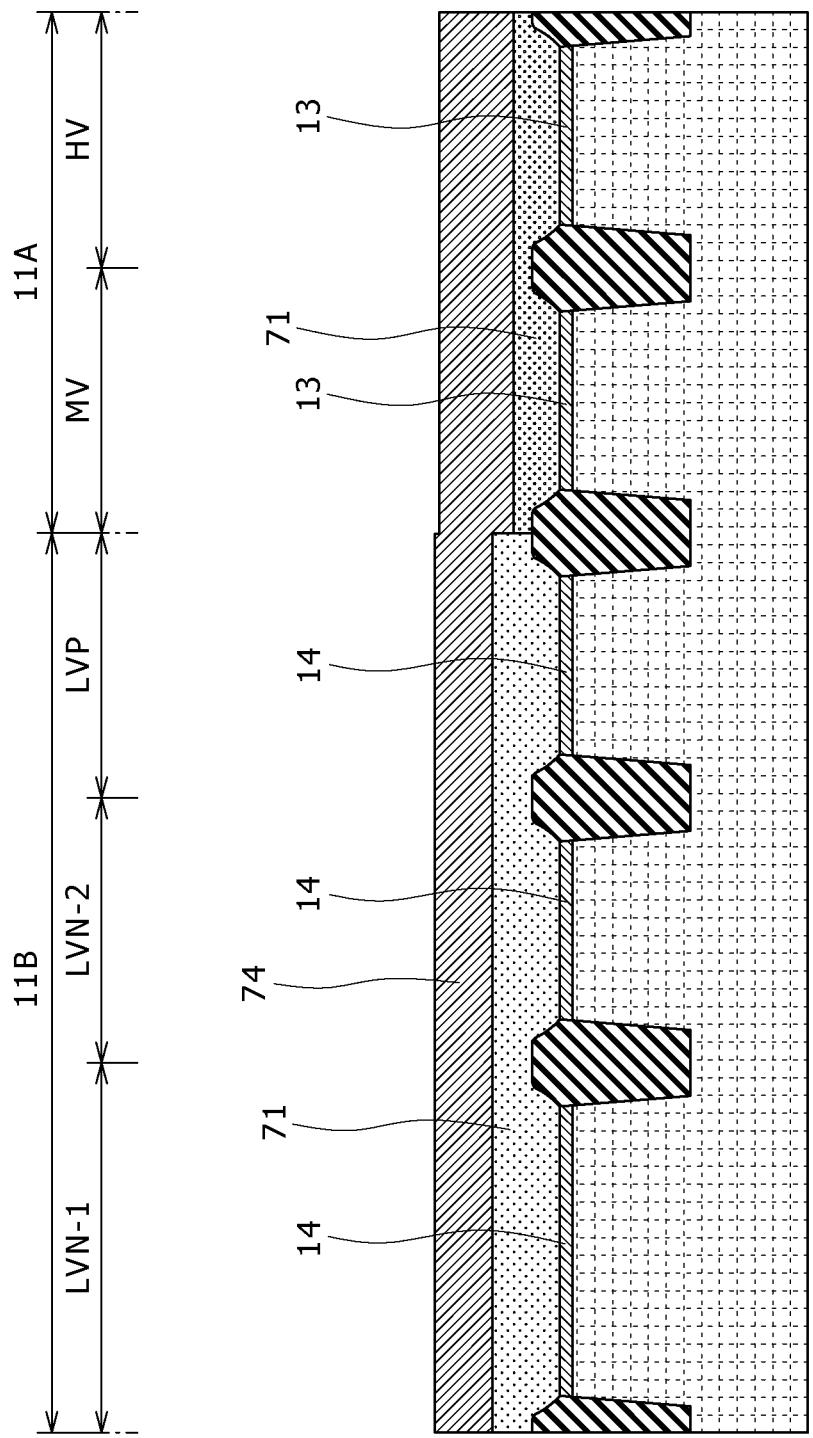
Figure 4A:
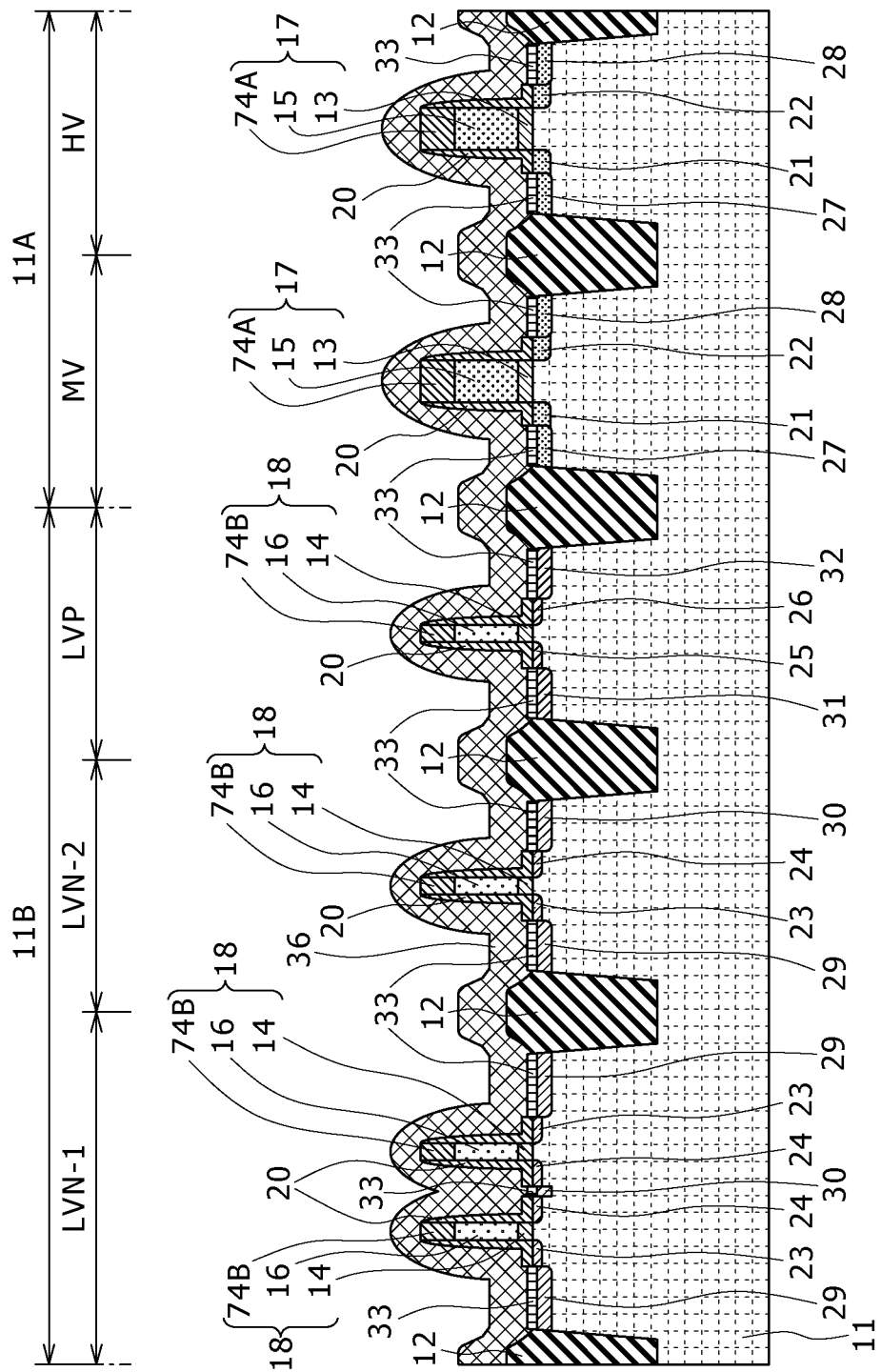
Figure 4B:
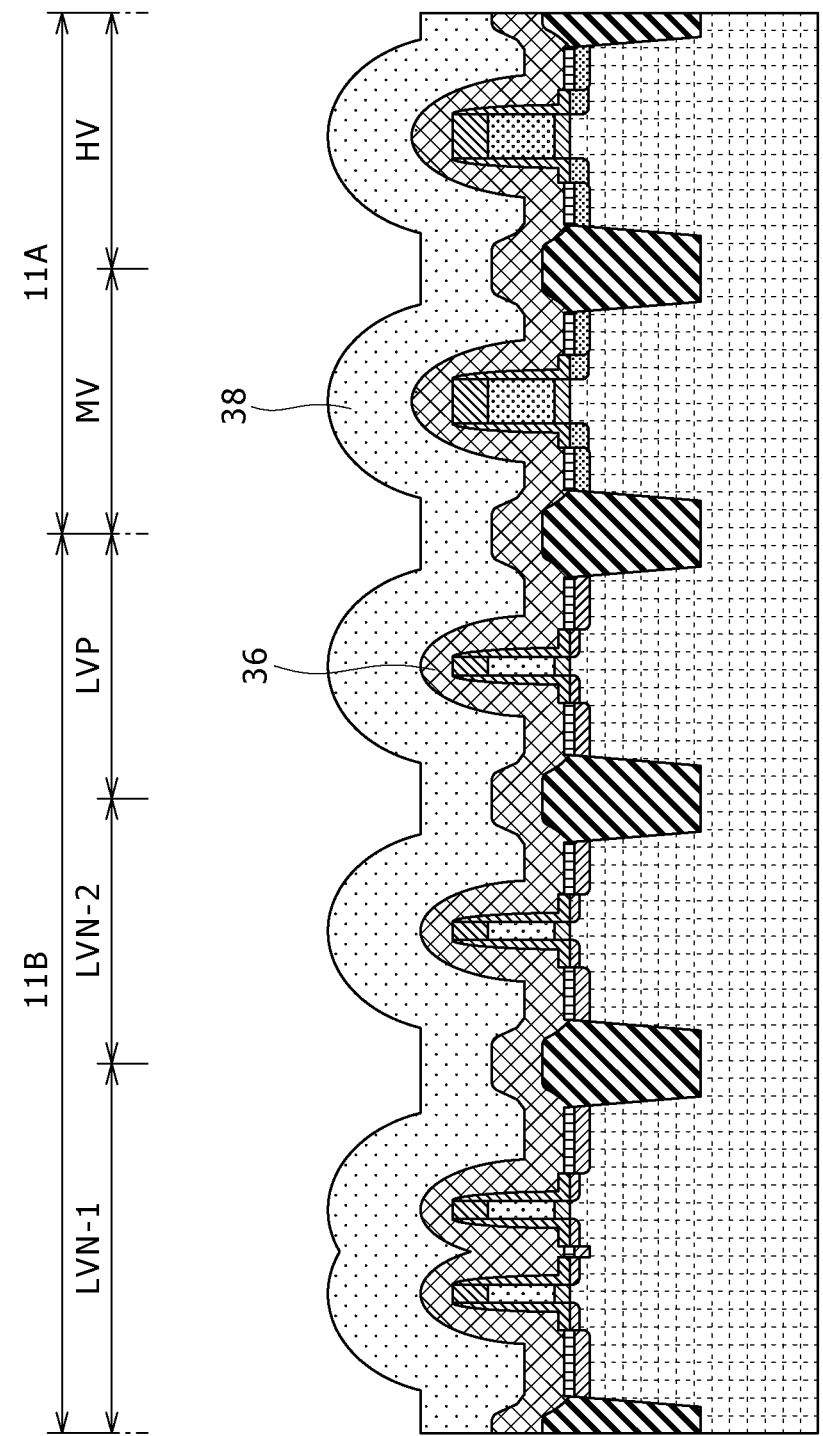
Figure 4C:
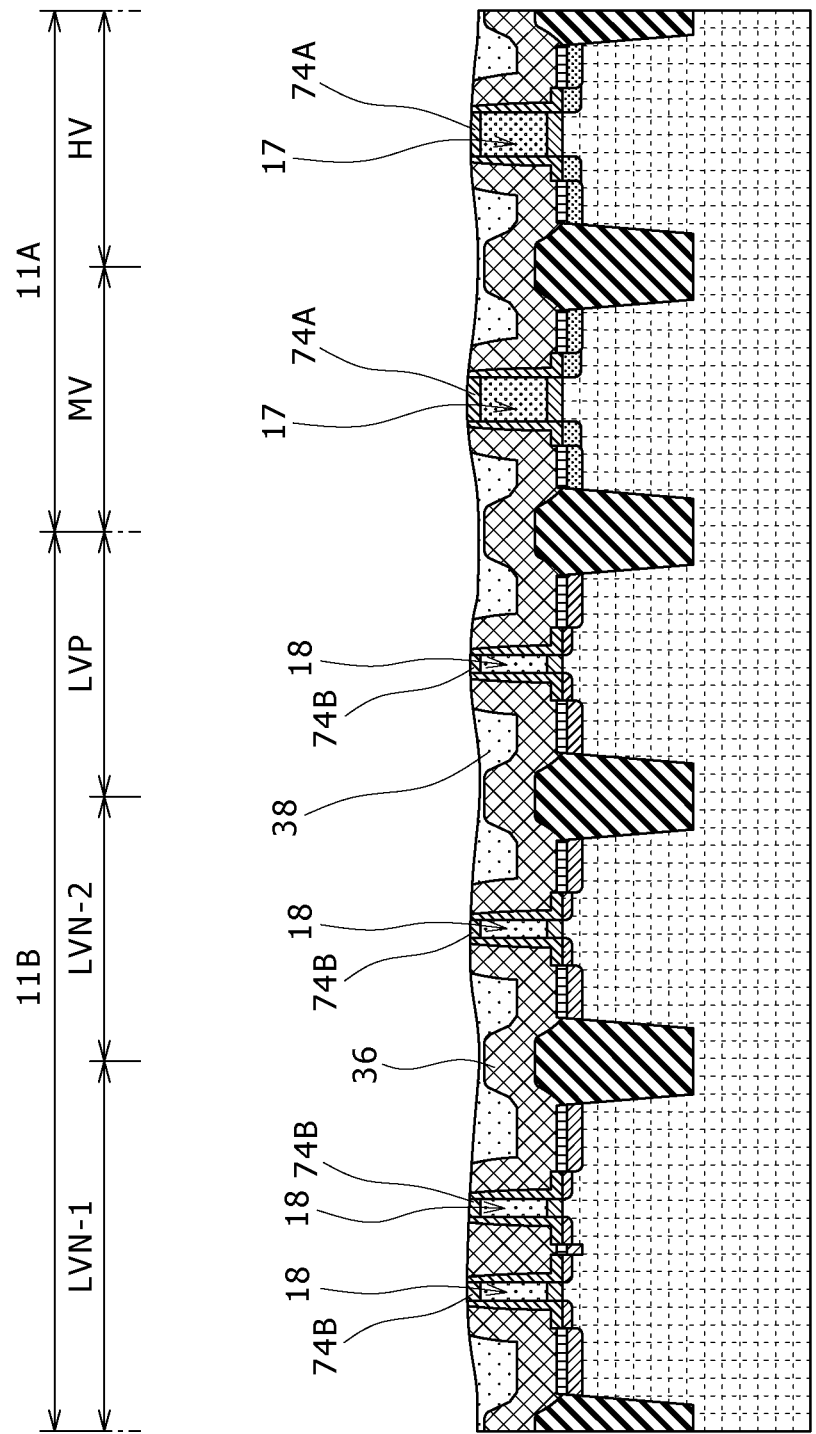
Figure 4D:
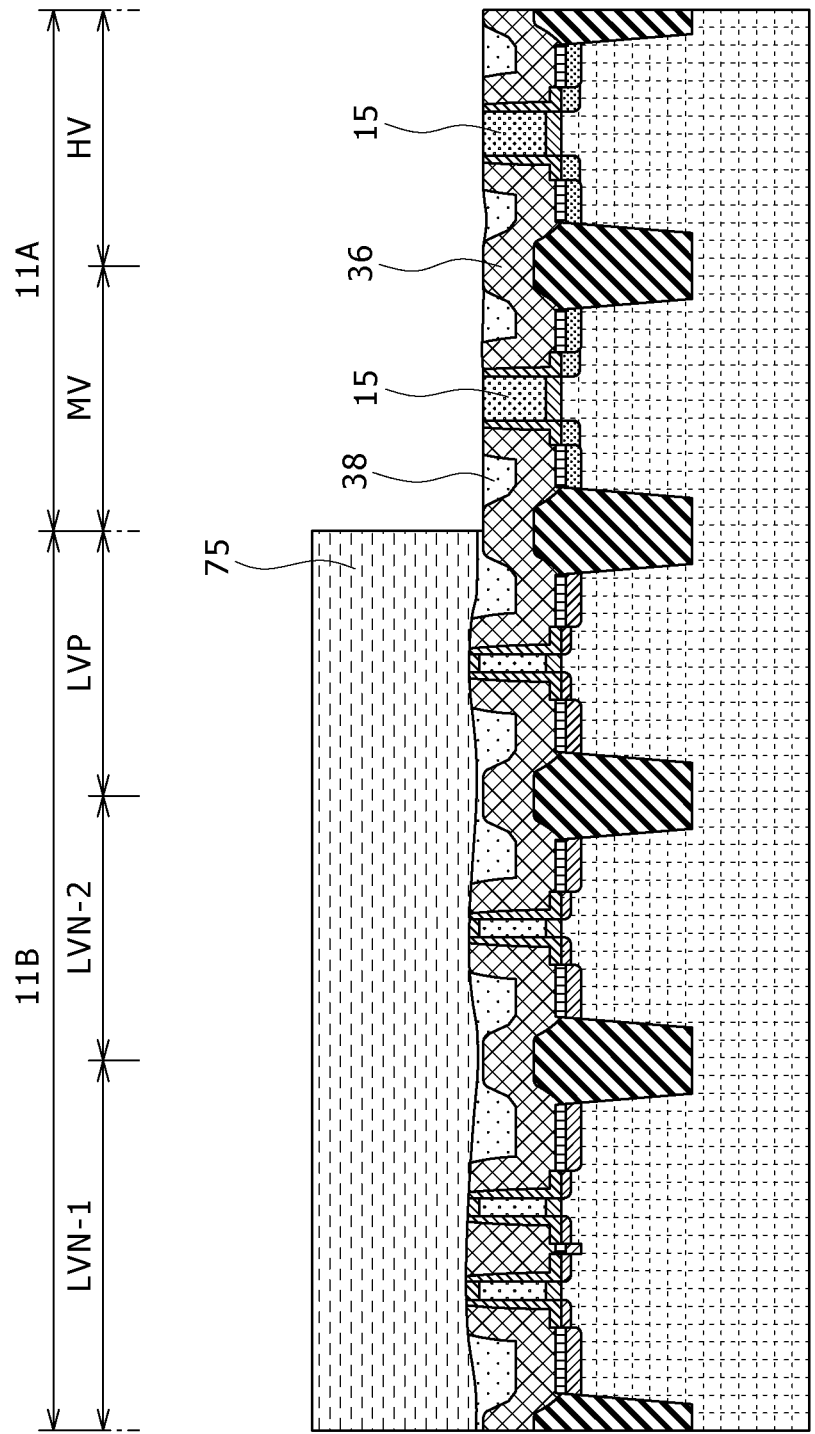
Figure 4E:
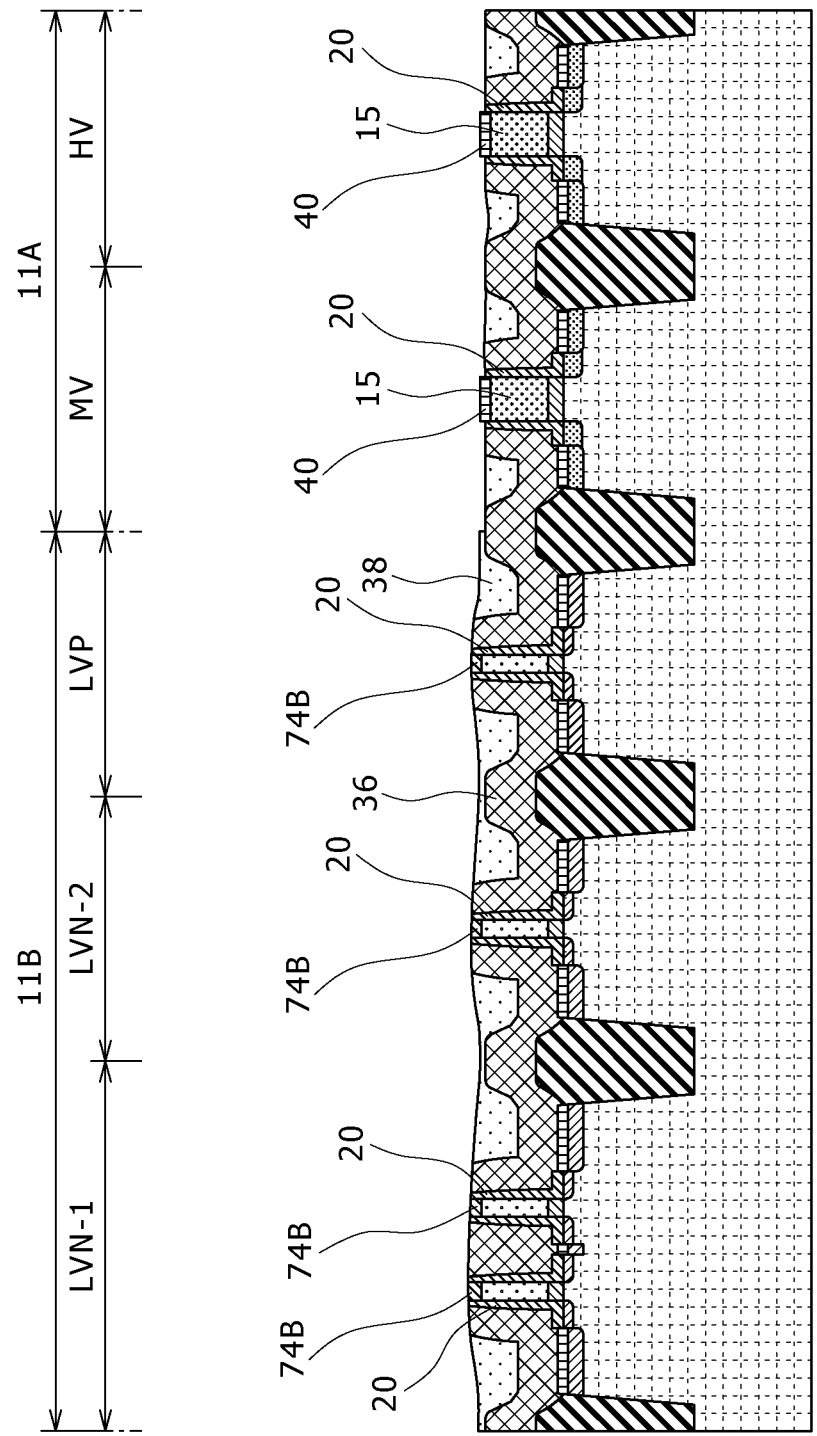
Figure 4F:
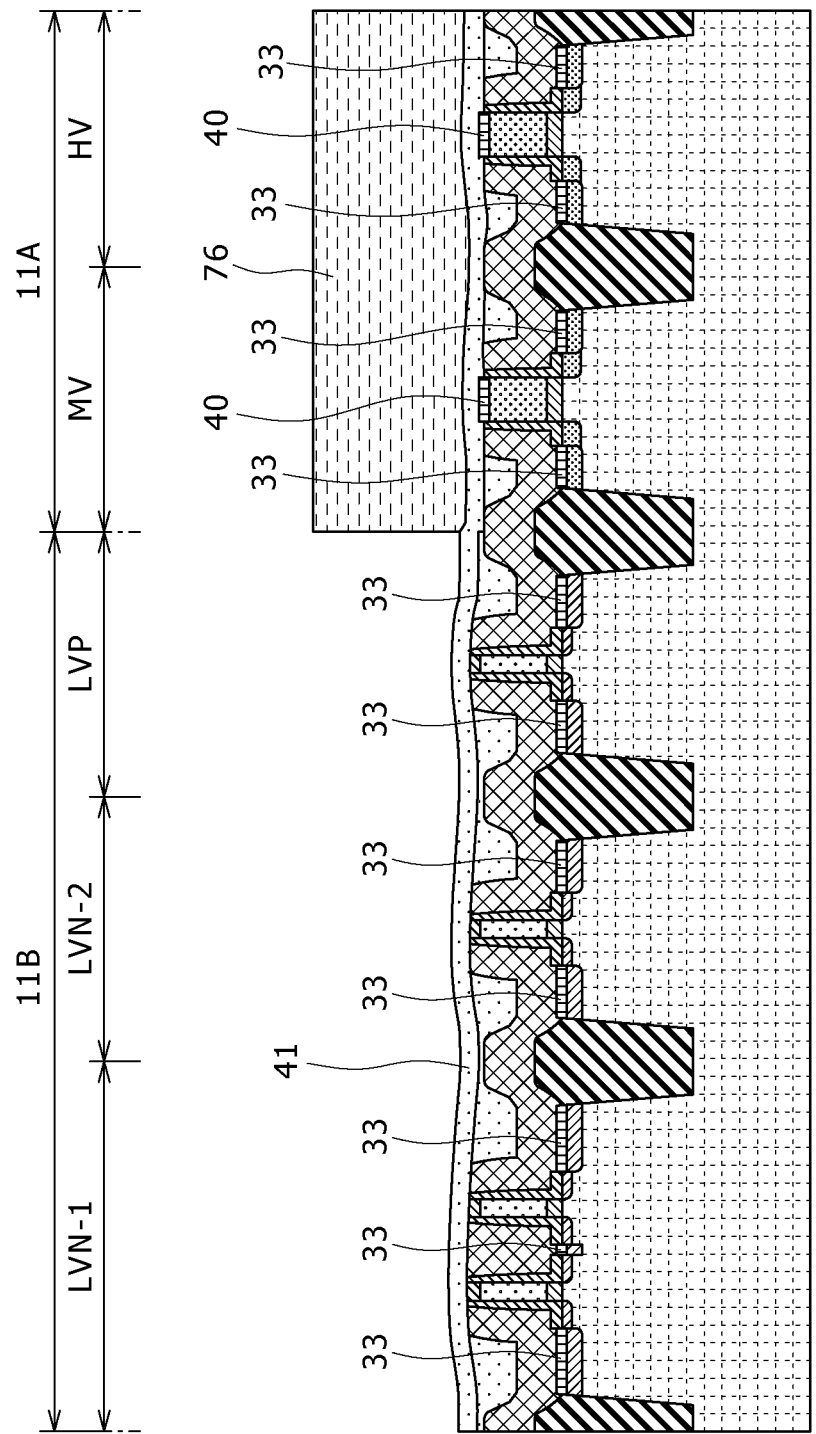
Figure 4G:
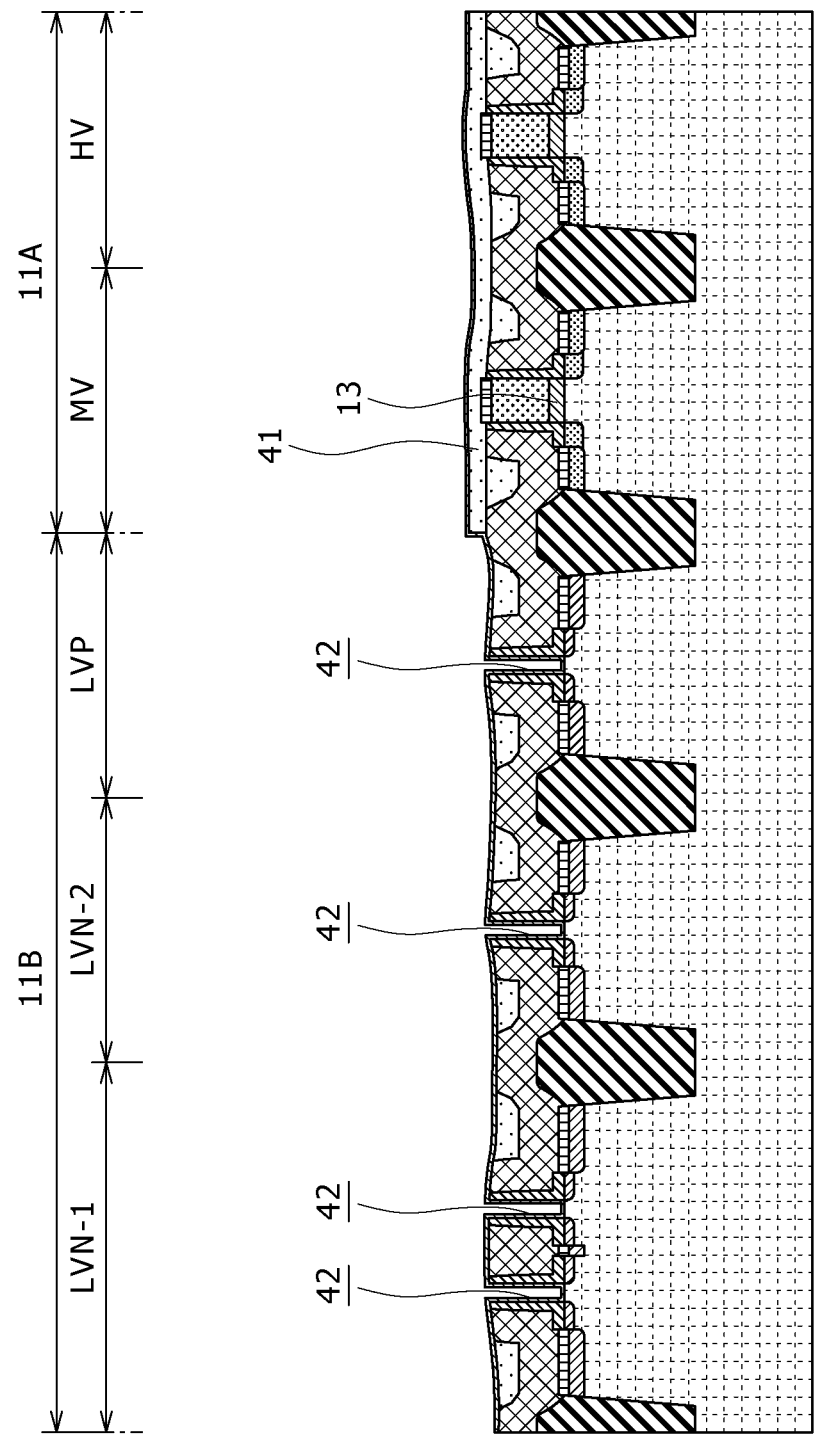
Figure 4H:
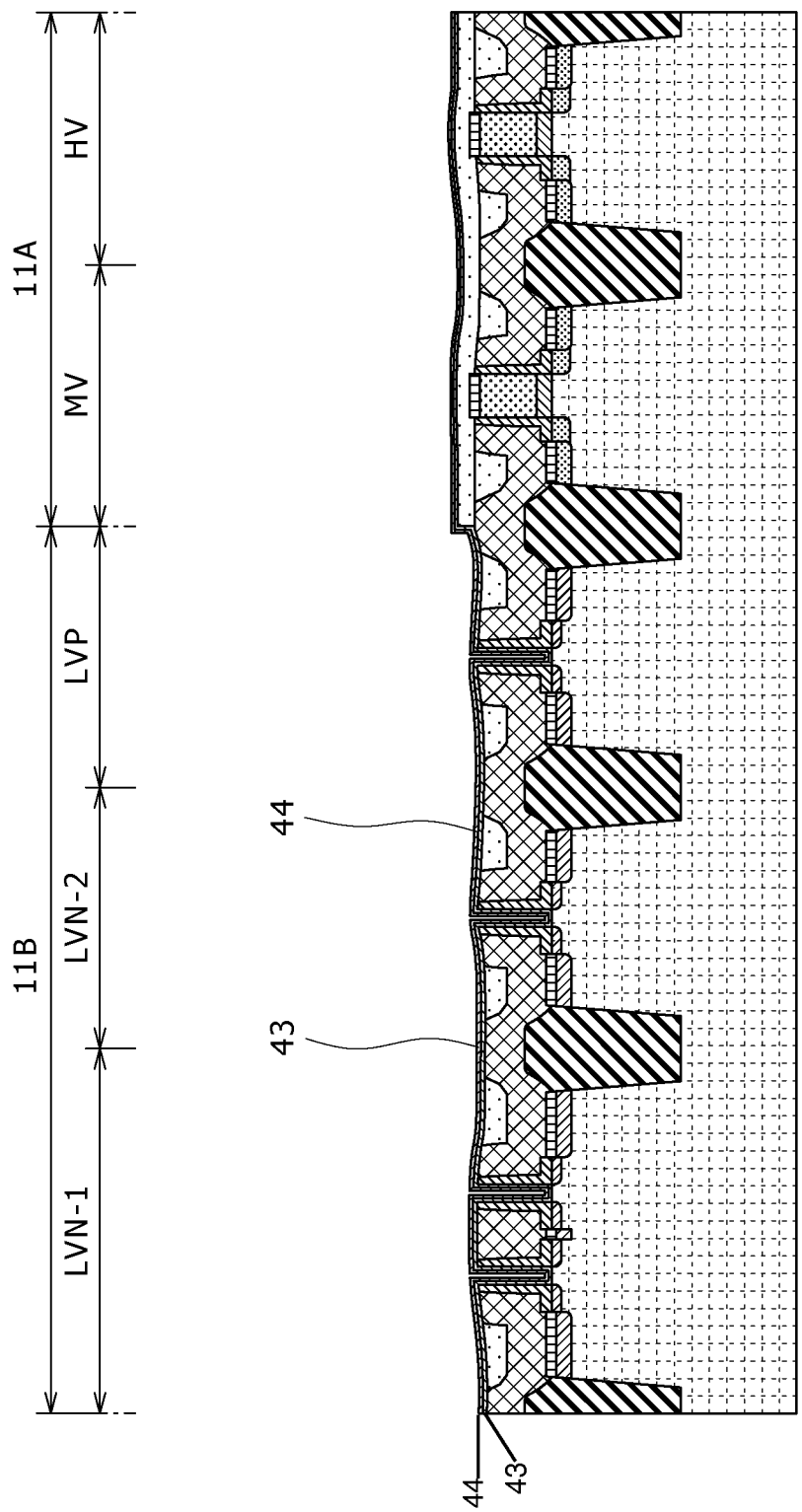
Figure 4I:
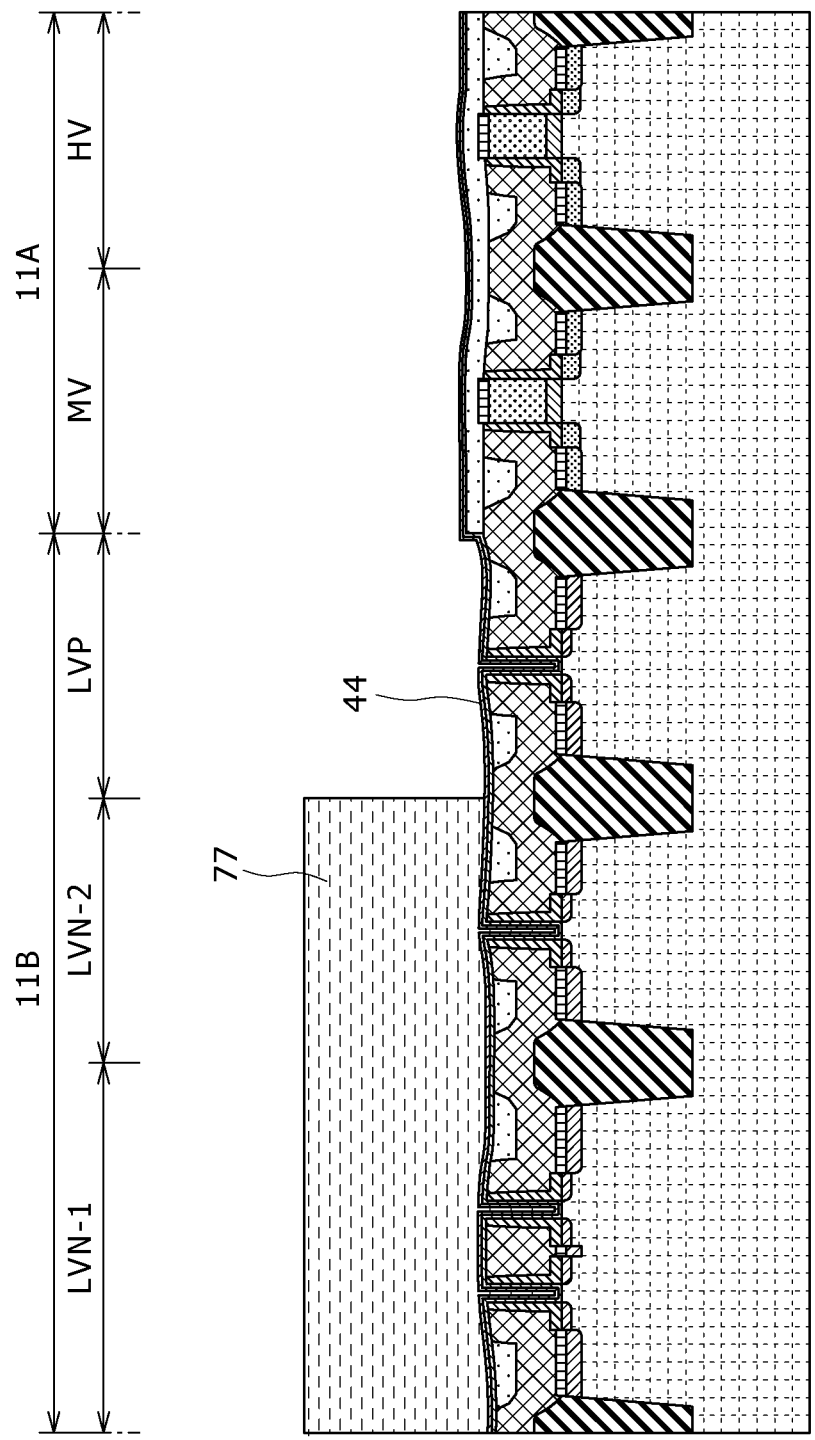
Figure 4J:
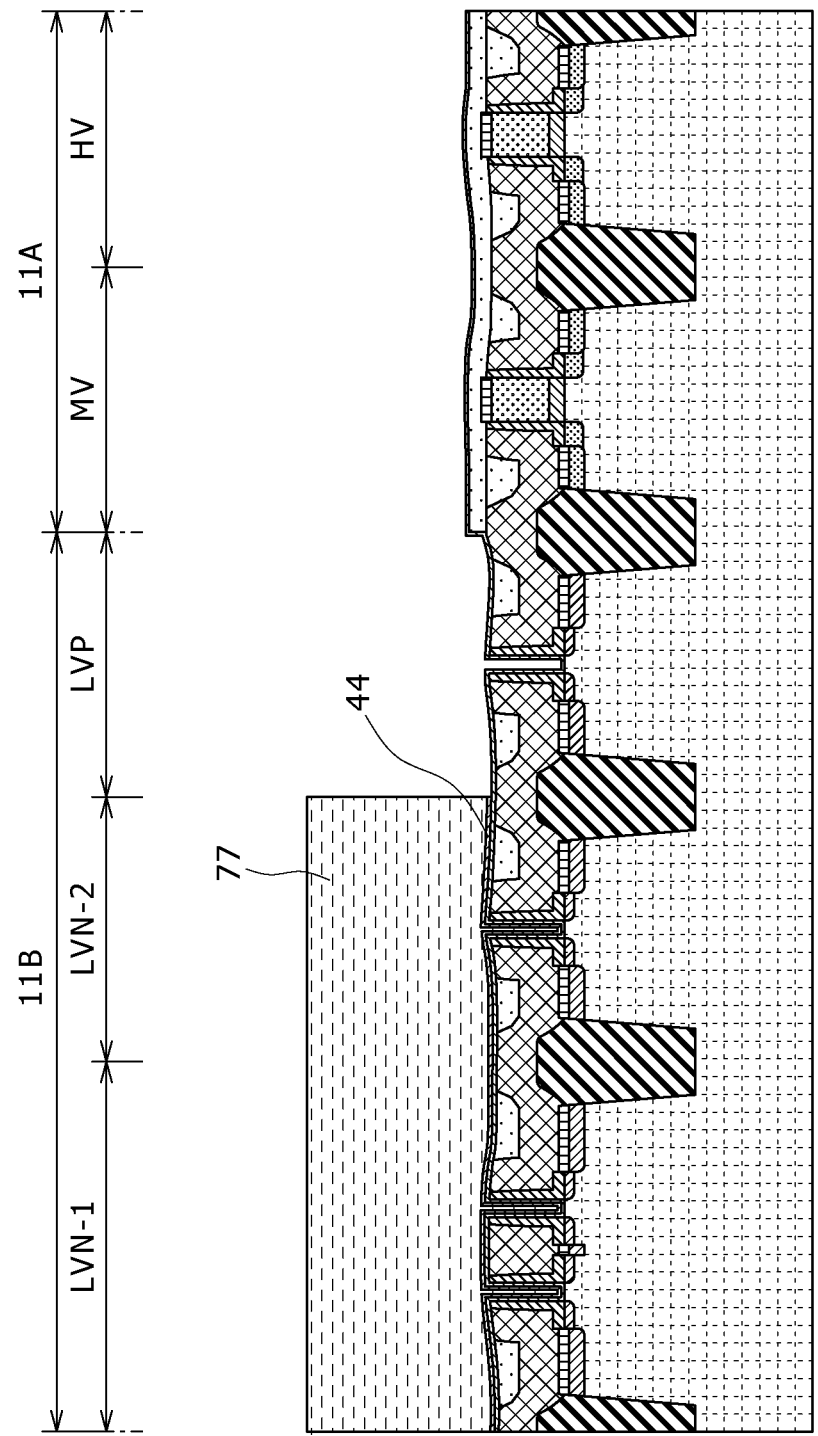
Figure 4K:
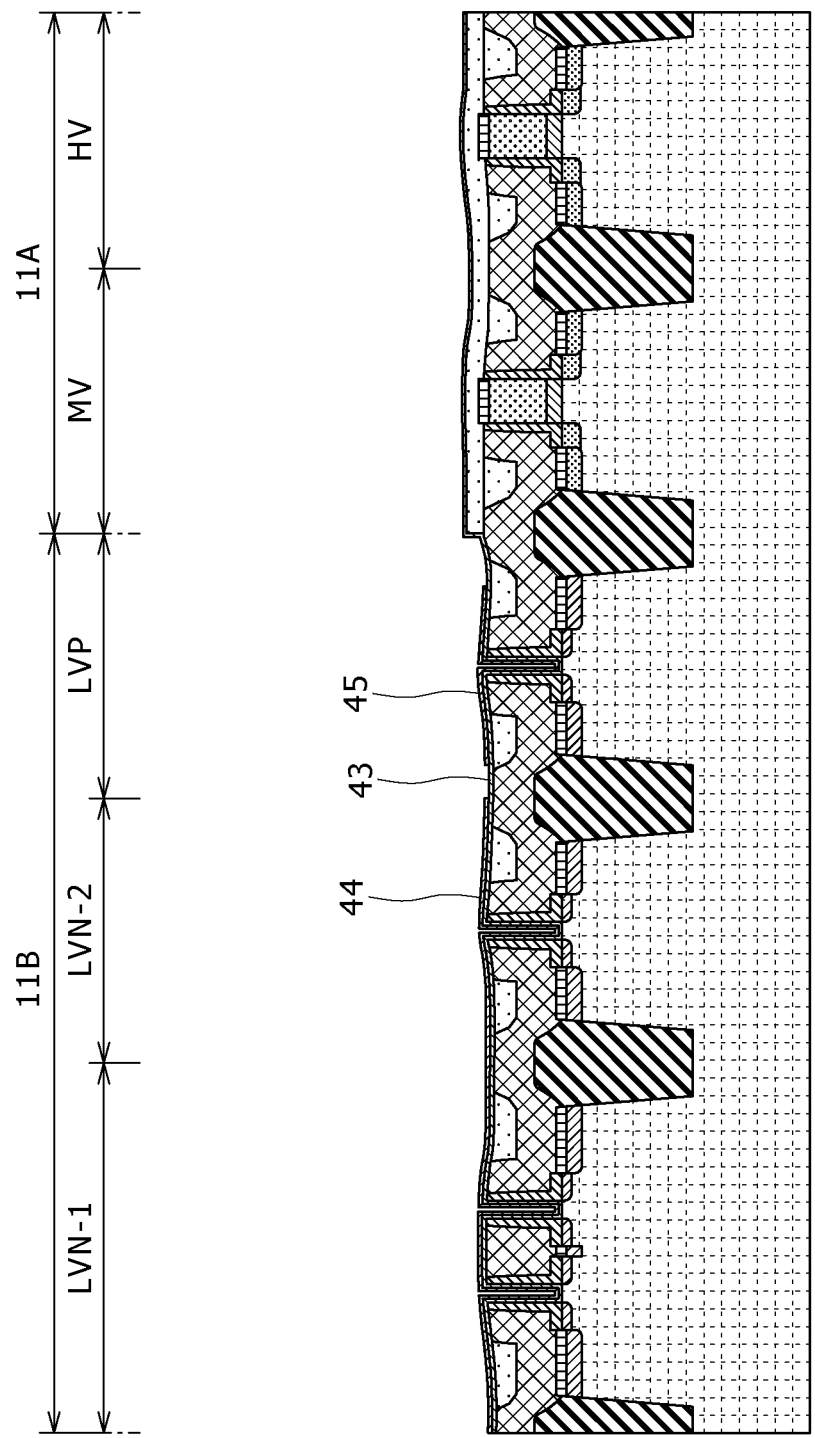
Figure 4L:
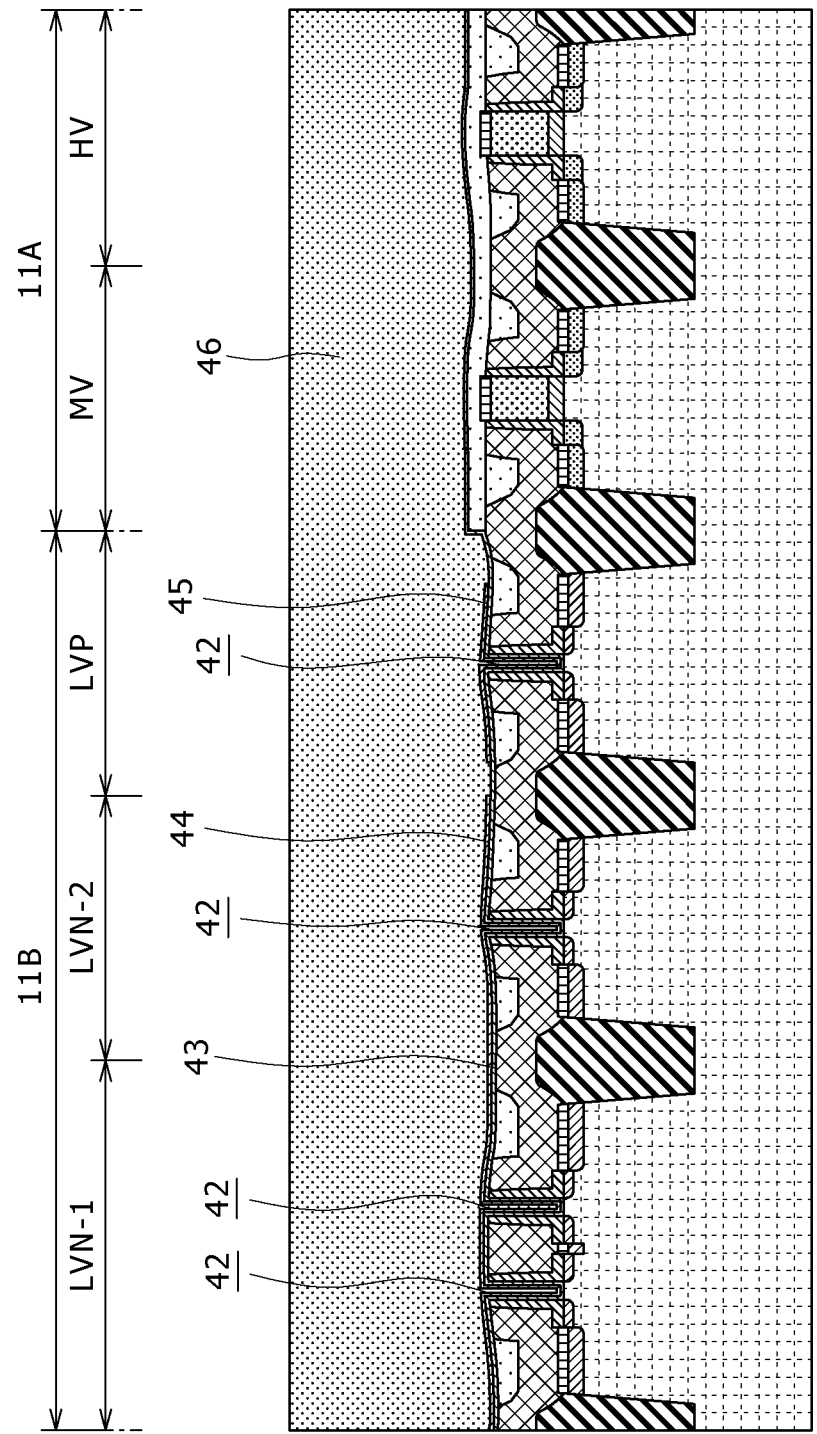

To avoid this problem, as shown in FIG. 3B, the surface of the hard mask layer 74 is planarized. For this planarization, e.g. chemical mechanical polishing (CMP) is used. Subsequently, similarly to the above description of the first embodiment, a resist pattern (not shown) for forming first gate electrodes and dummy gate electrodes is formed on the hard mask layer 74 by resist coating and a lithography technique. Thereafter, the hard mask layer 74, the electrode forming film 71, the gate insulating film 13, the dummy gate insulating film 14, and so on are processed by e.g. anisotropic etching with use of this resist pattern as the etching mask. Thereby, gate parts (not shown) composed of the hard mask layer 74, first gate electrodes 15, and the gate insulating film 13 are formed, and dummy gate parts (not shown) composed of the hard mask layer 74, dummy gate electrodes 16, and the dummy gate insulating film 14 are formed. Subsequently, a step of forming a liner film (not shown) covering the gate parts and the dummy gate parts and the subsequent steps are carried out. However, the step of removing upper parts of the first gate electrodes 15 in the first area, described with FIGS. 1B and 1C for the first embodiment, is not carried out, because the height of the gate electrodes has been already set smaller than that of the dummy gate electrodes. That is, the interlayer insulating film 38 is formed immediately after the liner insulating film 36 is formed.

In the above-described fourth embodiment, after the hard mask layer 74 is formed, polishing is performed to eliminate a step on the surface thereof and thereby planarize the surface of the hard mask layer 74. This makes it possible to carry out the subsequent lithography step and etching step for forming the gate parts and the dummy gate parts with high accuracy. Furthermore, the technique of planarizing the hard mask layer in this fourth embodiment can be applied to a technique of planarizing the surface of a hard mask layer in the second embodiment, if the hard mask layer is formed after the formation of the electrode forming film 71 in the second embodiment.

It should be understood by those skilled in the art that various modifications, combinations, sub-combinations and alternations may occur depending on design requirements and other factors insofar as they are within the scope of the appended claims or the equivalent thereof.

What is claimed is:

1. A method for manufacturing a semiconductor device that has on a semiconductor substrate a first transistor group and a second transistor group whose operating voltage is lower than an operating voltage of the first transistor group, the first transistor group having a first gate electrode formed over the semiconductor substrate with intermediary of a first gate insulating film and a silicide layer formed on the first gate electrode, the second transistor group having a second gate electrode formed with intermediary of a second gate insulating film in a gate forming trench that is formed by removing a dummy gate part formed over the semiconductor substrate, the method comprising the steps of:

forming the first gate electrode out of an electrode forming film comprising polysilicon;

forming a dummy gate electrode out of the same electrode forming film;

removing an upper part of the polysilicon to set a height of the first gate electrode to be smaller than a height of the dummy gate electrode in the dummy gate part in which a thickness of the first gate electrode derived from the electrode forming film comprising polysilicon is smaller than a thickness of a portion of the electrode forming film corresponding to the dummy gate electrode;

forming the silicide layer on the first gate electrode of the first transistor group after setting the height of the first gate electrode to be smaller than the height of the dummy gate electrode formed in the dummy gate part; and forming the gate forming trench by removing the dummy gate part after forming an interlayer insulating film that covers the silicide layer and planarizing a surface of the interlayer insulating film.

2. The method for manufacturing the semiconductor device according to claim 1, comprising the steps of:

forming a gate part arising from sequential stacking of the first gate insulating film, the first gate electrode, and a hard mask in a first area in which the first transistor group is to be formed on the semiconductor substrate, and simultaneously forming the dummy gate part arising from sequential stacking of a dummy gate insulating film, the dummy gate electrode, and a hard mask in a second area in which the second transistor group is to be formed;

forming first source/drain regions of the first transistor group in the first area of the semiconductor substrate and forming second source/drain regions of the second transistor group in the second area of the semiconductor substrate;

forming a liner insulating film that covers the gate part in the first area and the dummy gate part, and then exposing the first gate electrode by removing the liner insulating film and the hard mask above the gate part;

forming the silicide layer on an upper surface of the first gate electrode in the first area;

forming the interlayer insulating film that covers the silicide layer on the liner insulating film;

forming the gate forming trench by removing the dummy gate part in the second area; and forming the second gate insulating film in the gate forming trench, and then filling the gate forming trench with an electrically-conductive material to form the second gate electrode.

3. The method for manufacturing the semiconductor device according to claim 1, comprising the steps of:

sequentially forming the first gate insulating film and the electrode forming film for forming the first gate electrode over the semiconductor substrate, and then forming a hard mask layer after removing the upper part of polysilicon of the electrode forming film in a first area in which the first transistor group is to be formed;

forming a gate part arising from sequential stacking of the first gate insulating film, the first gate electrode formed of the electrode forming film, and a hard mask formed of the hard mask layer in the first area in which the first transistor group is to be formed, and simultaneously forming the dummy gate part arising from sequential stacking of a dummy gate insulating film formed of the first gate insulating film, the dummy gate electrode formed of the electrode forming film, and a hard mask formed of the hard mask layer in a second area in which the second transistor group is to be formed;

forming first source/drain regions of the first transistor group in the first area of the semiconductor substrate and forming second source/drain regions of the second transistor group in the second area of the semiconductor substrate;

forming a liner insulating film that covers the gate part in the first area and the dummy gate part, and then exposing the first gate electrode by removing the liner insulating film and the hard mask above the gate part;

forming the silicide layer on an upper surface of the first gate electrode in the first area;

forming the interlayer insulating film that covers the silicide layer on the liner insulating film;

forming the gate forming trench by removing the dummy gate part in the second area; and forming the second gate insulating film in the gate forming trench, and then filling the gate forming trench with an electrically-conductive material to form the second gate electrode.

4. The method for manufacturing the semiconductor device according to claim 1, comprising the steps of:

forming the first gate insulating film and an electrode forming film for forming the first gate electrode over the semiconductor substrate, and then forming a hard mask layer on the electrode forming film;

forming a gate part arising from sequential stacking of the first gate insulating film, the first gate electrode formed of the electrode forming film, and a hard mask formed of the hard mask layer in a first area in which the first transistor group is to be formed, and simultaneously forming the dummy gate part arising from sequential stacking of a dummy gate insulating film formed of the first gate insulating film, the dummy gate electrode formed of the electrode forming film whose height is greater than the height of the first gate electrode, and a hard mask formed of the hard mask layer in the second area in which the second transistor group is to be formed;

forming first source/drain regions of the first transistor group in the first area of the semiconductor substrate and forming second source/drain regions of the second transistor group in the second area of the semiconductor substrate;

forming a liner insulating film that covers the gate part in the first area and the dummy gate part, and then exposing the first gate electrode by removing the liner insulating film and the hard mask above the gate part;

forming the silicide layer on an upper surface of the first gate electrode in the first area;

forming the interlayer insulating film that covers the silicide layer on the liner insulating film;

forming the gate forming trench by removing the dummy gate part in the second area; and forming the second gate insulating film in the gate forming trench, and then filling the gate forming trench with an electrically-conductive material to form the second gate electrode.

5. The method for manufacturing the semiconductor device according to claim 3, wherein after the hard mask layer is formed, a surface of the hard mask layer is planarized by chemical mechanical polishing before the gate part and the dummy gate part are formed.

6. The method for manufacturing the semiconductor device according to claim 4, wherein
after the hard mask layer is formed, a surface of the hard mask layer is planarized by chemical mechanical polishing before the gate part and the dummy gate part are formed.

7. The method for manufacturing the semiconductor device according to claim 1, wherein the second gate insulating film has an insulating film whose relative dielectric constant is higher than a relative dielectric constant of the first gate insulating film.

* * * * *